United States Patent
Okhonin

(10) Patent No.: US 9,240,496 B2
(45) Date of Patent: *Jan. 19, 2016

(54) SEMICONDUCTOR DEVICE WITH FLOATING GATE AND ELECTRICALLY FLOATING BODY

(71) Applicant: Micron Technology, Inc., Boise, ID (US)

(72) Inventor: Serguei Okhonin, Lausanne (CH)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/341,866

(22) Filed: Jul. 28, 2014

(65) Prior Publication Data

US 2014/0334229 A1 Nov. 13, 2014

Related U.S. Application Data

(63) Continuation of application No. 13/964,777, filed on Aug. 12, 2013, now Pat. No. 8,792,276, which is a continuation of application No. 12/770,249, filed on Apr. 29, 2010, now Pat. No. 8,508,994.

(60) Provisional application No. 61/174,075, filed on Apr. 30, 2009.

(51) Int. Cl.
*G11C 14/00* (2006.01)
*H01L 29/788* (2006.01)
(Continued)

(52) U.S. Cl.
CPC ............ *H01L 29/788* (2013.01); *G11C 11/404* (2013.01); *G11C 14/0018* (2013.01);
(Continued)

(58) Field of Classification Search
CPC .... G11C 16/12; G11C 16/26; G11C 16/0408; G11C 16/0416; G11C 11/404; G11C 14/0018; G11C 2211/4016; H01L 29/788; H01L 29/7841; H01L 29/7885; H01L 29/66825; H01L 27/108; H01L 27/10802
USPC ................... 365/185.08, 185.05, 185.26
See application file for complete search history.

(56) References Cited

U.S. PATENT DOCUMENTS

| 3,439,214 A | 4/1969 | Kabell |
| 3,997,799 A | 12/1976 | Baker |

(Continued)

FOREIGN PATENT DOCUMENTS

| CA | 272437 A | 7/1927 |
| EP | 030856 A1 | 6/1981 |

(Continued)

OTHER PUBLICATIONS

Arimoto et al., A Configurable Enhanced T2RAM Macro for System-Level Power Management Unified Memory, 2006, VLSI Symposium, 2 pages.

(Continued)

*Primary Examiner* — Pho M Luu
(74) *Attorney, Agent, or Firm* — Wilmer Cutler Pickering Hale and Dorr LLP

(57) ABSTRACT

Techniques for providing floating body memory devices are disclosed. In one particular exemplary embodiment, the techniques may be realized as a semiconductor device comprising a floating gate, a control gate disposed over the floating gate, a body region that is electrically floating, wherein the body region is configured so that material forming the body region is contained under at least one lateral boundary of the floating gate, and a source region and a drain region adjacent the body region.

24 Claims, 13 Drawing Sheets

(51) Int. Cl.

| | | |
|---|---|---|
| *G11C 11/404* | (2006.01) | |
| *H01L 27/108* | (2006.01) | |
| *H01L 29/66* | (2006.01) | |
| *H01L 29/78* | (2006.01) | |
| *G11C 16/12* | (2006.01) | |
| *G11C 16/26* | (2006.01) | |
| *G11C 16/04* | (2006.01) | |
| *H01L 29/792* | (2006.01) | |

(52) U.S. Cl.
CPC ............ *G11C16/0408* (2013.01); *G11C 16/12* (2013.01); *G11C 16/26* (2013.01); *H01L 27/108* (2013.01); *H01L 27/10802* (2013.01); *H01L 29/66825* (2013.01); *H01L 29/7841* (2013.01); *H01L 29/7885* (2013.01); *G11C 16/0416* (2013.01); *G11C 2211/4016* (2013.01); *H01L 29/66833* (2013.01); *H01L 29/792* (2013.01)

(56) References Cited

U.S. PATENT DOCUMENTS

| | | | |
|---|---|---|---|
| 4,032,947 | A | 6/1977 | Kesel et al. |
| 4,250,569 | A | 2/1981 | Sasaki et al. |
| 4,262,340 | A | 4/1981 | Sasaki et al. |
| 4,298,962 | A | 11/1981 | Hamano et al. |
| 4,371,955 | A | 2/1983 | Sasaki |
| 4,630,089 | A | 12/1986 | Sasaki et al. |
| 4,658,377 | A | 4/1987 | McElroy |
| 4,791,610 | A | 12/1988 | Takemae |
| 4,807,195 | A | 2/1989 | Busch et al. |
| 4,954,989 | A | 9/1990 | Auberton-Herve et al. |
| 4,979,014 | A | 12/1990 | Hieda et al. |
| 5,010,524 | A | 4/1991 | Fifield et al. |
| 5,144,390 | A | 9/1992 | Matloubian |
| 5,164,805 | A | 11/1992 | Lee |
| 5,258,635 | A | 11/1993 | Nitayama et al. |
| 5,313,432 | A | 5/1994 | Lin et al. |
| 5,315,541 | A | 5/1994 | Harari et al. |
| 5,350,938 | A | 9/1994 | Matsukawa et al. |
| 5,355,330 | A | 10/1994 | Hisamoto et al. |
| 5,388,068 | A | 2/1995 | Ghoshal et al. |
| 5,397,726 | A | 3/1995 | Bergemont |
| 5,432,730 | A | 7/1995 | Shubat et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,506,436 | A | 4/1996 | Hayashi et al. |
| 5,515,383 | A | 5/1996 | Katoozi |
| 5,526,307 | A | 6/1996 | Yiu et al. |
| 5,528,062 | A | 6/1996 | Hsieh et al. |
| 5,568,356 | A | 10/1996 | Schwartz |
| 5,583,808 | A | 12/1996 | Brahmbhatt |
| 5,593,912 | A | 1/1997 | Rajeevakumar |
| 5,606,188 | A | 2/1997 | Bronner et al. |
| 5,608,250 | A | 3/1997 | Kalnitsky |
| 5,627,092 | A | 5/1997 | Alsmeier et al. |
| 5,631,186 | A | 5/1997 | Park et al. |
| 5,677,867 | A | 10/1997 | Hazani |
| 5,696,718 | A | 12/1997 | Hartmann |
| 5,740,099 | A | 4/1998 | Tanigawa |
| 5,754,469 | A | 5/1998 | Hung et al. |
| 5,774,411 | A | 6/1998 | Hsieh et al. |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,798,968 | A | 8/1998 | Lee et al. |
| 5,811,283 | A | 9/1998 | Sun |
| 5,847,411 | A | 12/1998 | Morii |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,929,479 | A | 7/1999 | Oyama |
| 5,930,648 | A | 7/1999 | Yang |
| 5,936,265 | A | 8/1999 | Koga |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,962,890 | A | 10/1999 | Sato |
| 5,963,473 | A | 10/1999 | Norman |
| 5,968,840 | A | 10/1999 | Park et al. |
| 5,977,578 | A | 11/1999 | Tang |
| 5,982,003 | A | 11/1999 | Hu et al. |
| 5,986,914 | A | 11/1999 | McClure |
| 6,018,172 | A | 1/2000 | Hidaka et al. |
| 6,048,756 | A | 4/2000 | Lee et al. |
| 6,081,443 | A | 6/2000 | Morishita et al. |
| 6,096,598 | A | 8/2000 | Furukawa et al. |
| 6,097,056 | A | 8/2000 | Hsu et al. |
| 6,097,624 | A | 8/2000 | Chung et al. |
| 6,111,778 | A | 8/2000 | MacDonald et al. |
| 6,121,077 | A | 9/2000 | Hu et al. |
| 6,133,597 | A | 10/2000 | Li et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,698 | B1 | 1/2001 | Gruening et al. |
| 6,177,708 | B1 | 1/2001 | Kuang et al. |
| 6,214,694 | B1 | 4/2001 | Leobandung et al. |
| 6,222,217 | B1 | 4/2001 | Kunikiyo |
| 6,225,158 | B1 | 5/2001 | Furukawa et al. |
| 6,229,161 | B1 | 5/2001 | Nemati et al. |
| 6,245,613 | B1 | 6/2001 | Hsu et al. |
| 6,252,281 | B1 | 6/2001 | Yamamoto et al. |
| 6,262,935 | B1 | 7/2001 | Parris et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,333,532 | B1 | 12/2001 | Davari et al. |
| 6,333,866 | B1 | 12/2001 | Ogata |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,432,769 | B1 | 8/2002 | Fukuda et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B2 | 10/2002 | Fujita et al. |
| 6,479,862 | B1 | 11/2002 | King et al. |
| 6,480,407 | B1 | 11/2002 | Keeth |
| 6,492,211 | B1 | 12/2002 | Divakaruni et al. |
| 6,518,105 | B1 | 2/2003 | Yang et al. |
| 6,531,754 | B1 | 3/2003 | Nagano et al. |
| 6,537,871 | B2 | 3/2003 | Forbes et al. |
| 6,538,916 | B2 | 3/2003 | Ohsawa |
| 6,544,837 | B1 | 4/2003 | Divakauni et al. |
| 6,548,848 | B2 | 4/2003 | Horiguchi et al. |
| 6,549,450 | B1 | 4/2003 | Hsu et al. |
| 6,552,398 | B2 | 4/2003 | Hsu et al. |
| 6,552,932 | B1 | 4/2003 | Cernea |
| 6,556,477 | B2 | 4/2003 | Hsu et al. |
| 6,560,142 | B1 | 5/2003 | Ando |
| 6,563,733 | B2 | 5/2003 | Liu et al. |
| 6,566,177 | B1 | 5/2003 | Radens et al. |
| 6,567,330 | B2 | 5/2003 | Fujita et al. |
| 6,573,566 | B2 | 6/2003 | Ker et al. |
| 6,574,135 | B1 | 6/2003 | Komatsuzaki |
| 6,590,258 | B2 | 7/2003 | Divakauni et al. |
| 6,590,259 | B2 | 7/2003 | Adkisson et al. |
| 6,617,651 | B2 | 9/2003 | Ohsawa |
| 6,621,725 | B2 | 9/2003 | Ohsawa |
| 6,632,723 | B2 | 10/2003 | Watanabe et al. |
| 6,650,565 | B1 | 11/2003 | Ohsawa |

(56) References Cited

U.S. PATENT DOCUMENTS

| | | |
|---|---|---|
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,891,225 B2 | 5/2005 | Horiguchi et al. |
| 6,894,913 B2 | 5/2005 | Yamauchi |
| 6,897,098 B2 | 5/2005 | Hareland et al. |
| 6,903,979 B1 | 6/2005 | Mirgorodski et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi et al. |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller et al. |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,460,395 B1 | 12/2008 | Cho et al. |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,589,995 B2 | 9/2009 | Tang et al. |
| 7,606,066 B2 | 10/2009 | Okhonin et al. |
| 7,684,249 B2 | 3/2010 | Chen et al. |
| 7,688,629 B2 | 3/2010 | Kim |
| 7,696,032 B2 | 4/2010 | Kim et al. |
| 8,085,594 B2 * | 12/2011 | Okhonin et al. ......... 365/185.18 |
| 8,102,714 B2 | 1/2012 | Chen et al. |
| 8,315,099 B2 | 11/2012 | Van Buskirk et al. |
| 8,508,994 B2 * | 8/2013 | Okhonin ................. 365/185.08 |
| 8,710,575 B1 * | 4/2014 | Meiser et al. ................. 257/318 |
| 8,792,276 B2 * | 7/2014 | Okhonin ................. 365/185.08 |
| 2001/0050406 A1 | 12/2001 | Akita et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee et al. |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2006/0256606 A1 | 11/2006 | Park |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |

(56) References Cited

U.S. PATENT DOCUMENTS

| | | |
|---|---|---|
| 2008/0133849 A1 | 6/2008 | Deml et al. |
| 2008/0144378 A1 | 6/2008 | Park et al. |
| 2008/0165577 A1 | 7/2008 | Fazan et al. |
| 2008/0251830 A1 | 10/2008 | Higashi et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 175378 A2 | 3/1986 |
| EP | 202515 A1 | 11/1986 |
| EP | 207619 A1 | 1/1987 |
| EP | 245515 A1 | 11/1987 |
| EP | 253631 A2 | 1/1988 |
| EP | 300157 A2 | 1/1989 |
| EP | 333426 A2 | 9/1989 |
| EP | 350057 A1 | 1/1990 |
| EP | 354348 A2 | 2/1990 |
| EP | 359551 A2 | 3/1990 |
| EP | 362961 A1 | 4/1990 |
| EP | 366882 A2 | 5/1990 |
| EP | 465961 A1 | 1/1992 |
| EP | 510607 A1 | 10/1992 |
| EP | 513923 A2 | 11/1992 |
| EP | 537677 A2 | 4/1993 |
| EP | 564204 A2 | 10/1993 |
| EP | 579566 A2 | 1/1994 |
| EP | 599388 A1 | 6/1994 |
| EP | 599506 A1 | 6/1994 |
| EP | 601590 A2 | 6/1994 |
| EP | 606758 A1 | 7/1994 |
| EP | 642173 A1 | 3/1995 |
| EP | 682370 A1 | 11/1995 |
| EP | 689252 A1 | 12/1995 |
| EP | 694977 A2 | 1/1996 |
| EP | 725402 A2 | 8/1996 |
| EP | 726601 A1 | 8/1996 |
| EP | 727820 A1 | 8/1996 |
| EP | 727822 A2 | 8/1996 |
| EP | 731972 A1 | 9/1996 |
| EP | 739097 A2 | 10/1996 |
| EP | 744772 A1 | 11/1996 |
| EP | 788165 A2 | 8/1997 |
| EP | 801427 A2 | 10/1997 |
| EP | 836194 A2 | 4/1998 |
| EP | 844671 A1 | 5/1998 |
| EP | 858109 A2 | 8/1998 |
| EP | 860878 A2 | 8/1998 |
| EP | 869511 A2 | 10/1998 |
| EP | 878804 A2 | 11/1998 |
| EP | 920059 A2 | 6/1999 |
| EP | 924766 A2 | 6/1999 |
| EP | 933820 A1 | 8/1999 |
| EP | 951072 A1 | 10/1999 |
| EP | 971360 A1 | 1/2000 |
| EP | 980101 A2 | 2/2000 |
| EP | 993037 A2 | 4/2000 |
| EP | 1073121 A2 | 1/2001 |
| EP | 1162663 A2 | 12/2001 |
| EP | 1162744 A1 | 12/2001 |
| EP | 1179850 A2 | 2/2002 |
| EP | 1180799 A2 | 2/2002 |
| EP | 1191596 A2 | 3/2002 |
| EP | 1204146 A1 | 5/2002 |
| EP | 1204147 A1 | 5/2002 |
| EP | 1209747 A2 | 5/2002 |
| EP | 1233454 A2 | 8/2002 |
| EP | 1237193 A2 | 9/2002 |
| EP | 1241708 A2 | 9/2002 |
| EP | 1253634 A2 | 10/2002 |
| EP | 1280205 A2 | 1/2003 |
| EP | 1288955 A2 | 3/2003 |
| FR | 2197494 A5 | 3/1974 |
| GB | 1414228 A | 11/1975 |
| JP | S62-007149 | 1/1987 |
| JP | 62-272561 A | 11/1987 |
| JP | 02-294076 A | 12/1990 |
| JP | 03-171768 A | 7/1991 |
| JP | H04-176163 U | 6/1992 |
| JP | 04-239177 A | 8/1992 |
| JP | 05-347419 A | 12/1993 |
| JP | 08-213624 A | 8/1996 |
| JP | 08-274277 A | 10/1996 |
| JP | H08-316337 | 11/1996 |
| JP | 09-046688 A | 2/1997 |
| JP | 09-082912 A | 3/1997 |
| JP | 10-242470 A | 9/1998 |
| JP | 11-087649 A | 3/1999 |
| JP | 12-247735 | 8/2000 |
| JP | 12-389106 A | 12/2000 |
| JP | 13-180633 A | 6/2001 |
| JP | 2002-009081 A | 1/2002 |
| JP | 2002-094027 A | 3/2002 |
| JP | 2002-176154 A | 6/2002 |
| JP | 2002-246571 A | 8/2002 |
| JP | 2002-329795 A | 11/2002 |
| JP | 2002-343886 A | 11/2002 |
| JP | 2002-353080 A | 12/2002 |
| JP | 2003-031693 A | 1/2003 |
| JP | 2003-68877 | 3/2003 |
| JP | 2003-086712 A | 3/2003 |
| JP | 2003-100641 A | 4/2003 |
| JP | 2003-100900 A | 4/2003 |
| JP | 2003-132682 A | 5/2003 |
| JP | 2003-203967 A | 7/2003 |
| JP | 2003-243528 A | 8/2003 |
| JP | 2004-335553 A | 11/2004 |
| WO | WO-01/24268 A1 | 4/2001 |
| WO | WO-2005/008778 A1 | 1/2005 |

OTHER PUBLICATIONS

Arimoto, A High-Density Scalable Twin Transistor RAM (TTRAM) With Verify Control for SOI Platform Memory IPs, Nov. 2007, IEEE J. Solid-State Circuits, vol. 22, No. 11, p. 2611-2619.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, p. 809-812.

Assaderaghi et al., "A Dynamic Threshold Voltage MOSFET (DTMOS) for Very Low Voltage Operation", IEEE Electron Device Letters, vol. 15, No. 12, Dec. 1994, p. 510-512.

Assaderaghi et al., "A Novel Silicon-On-Insulator (SOI) MOSFET for Ultra Low Voltage Operation", 1994 IEEE Symposium on Low Power Electronics, p. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, p. 414-422.

Assaderaghi et al., "High-Field Transport of Inversion-Layer Electrons and Holes Including Velocity Overshoot", IEEE Transactions on Electron Devices, vol. 44, No. 4, Apr. 1997, p. 664-671.

Avci, Floating Body Cell (FBC) Memory for 16-nm Technology with Low Variation on Thin Silicon and 10-nm BOX, Oct. 2008, SOI Conference, 2 pages.

Bae, Evaluation of 1T RAM using Various Operation Methods with SOONO (Silicon-On-ONO) device, Dec. 2008, IEDM, p. 805-808.

Ban et al., Integration of Back-Gate Doping for 15-nm Node Floating Body Cell (FBC) Memory, Components Research, Process Technology Modeling, presented in the 2010 VLSI Symposium on Jun. 17, 2010, 2 pages.

(56) References Cited

OTHER PUBLICATIONS

Ban, A Scaled Floating Body Cell (FBC) Memory with High-k+Metal Gate on Thin-Silicon and Thin-BOX for 16-nm Technology Node and Beyond, Jun. 2008, VLSI Symposium, p. 92-93.
Ban, Ibrahim, et al., "Floating Body Cell with Independently-Controlled Double Gates for High Density Memory," Electron Devices Meeting, 2006. IEDM '06. International, IEEE, p. 1-4, Dec. 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008, p. 795-798.
Blagojevic et al., Capacitorless 1T DRAM Sensing Scheme Automatice Reference Generation, IEEE J.Solid State Circuits, vol. 41, No. 6, pp. 1463-1470, 2006.
Blalock, T., "A High-Speed Clamped Bit-Line Current-Mode Sense Amplifier", IEEE Journal of Solid-State Circuits, vol. 26, No. 4, Apr. 1991, p. 542-548.
Butt, Scaling Limits of Double Gate and Surround Gate Z-RAM Cells, IEEE Trans. Elec. Dev., vol. 54, No. 9, p. 2255-2262, Sep. 2007.
Chan et al., "Effects of Floating Body on Double Polysilicon Partially Depleted SOI Nonvolatile Memory Cell", IEEE Electron Device Letters, vol. 24, No. 2, Feb. 2003, p. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009, p. 11.2.1-11.2.4.
Cho, A novel capacitor-less DRAM cell using Thin Capacitively-Coupled Thyristor (TCCT), 2005, IEDM, 4 pages.
Choi et al., Current Flow Mechanism in Schottky-Barrier MOSFET and Application to the 1T-DRAM, 2008, International Conference on SSDM, pp. 226-227.
Choi, High Speed Flash Memory and 1T-DRAM on Dopant Segregated Schottky Barrier (DSSB) FinFET SONOS Device for Multifunctional SoC Applications, Dec. 2008, IEDM, pp. 223-226.
Clarke, Junctionless Transistors Could Simply Chip Making, Say Researchers, EE Times, Feb. 2010, www.eetimes.com/showArticle.jhtml?articleID=223100050, 3 pages.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, IEEE EDL, vol. 30, No. 12, pp. 1377-1379, Dec. 2009.
Collaert, Comparison of scaled floating body RAM architectures, Oct. 2008, SOI Conference, 2 pages.
Ershov, Optimization of Substrate Doping for Back-Gate Control in SOI T-RAM Memory Technology, 2005, SOI Conference, pp. 1-2.
Ertosun et al., A Highly Scalable Capacitorless Double Gate Quantum Well Single Transistor DRAM: 1T-QW DRAM, 2008, IEEE EDL, pp. 1-3.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE, 14 pages.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, et al., Soft Error Performance of Z-RAM Floating Body Memory, 2006, SOI Conference, Lausanne, Switzerland, 2 pages.
Fisch, et al., Customizing SOI Floating Body Memory Architecture for System Performance and Lower Cost, 2006, SAME Forum, Lausanne, Switzerland, 3 pages.
Fisch, Z-Ram® Ultra-Dense Memory for 90nm and Below, 2006, Hot Chips, 35 pages.
Fossum et al., New Insights on Capacitorless Floating Body DRAM Cells, IEEE EDL, vol. 28, No. 6, pp. 513-516, Jun. 2007.
Fujita, Array Architecture of Floating Body Cell (FBC) with Quasi-Shielded Open Bit Line Scheme for sub-40nm Node, 2008, SOI Conference, 2 pages.
Furuhashi, et al., Scaling Scenario of Floating Body Cell (FBC) Suppressing $V_{th}$ Variation Due to Random Dopant Fluctuation, Dec. 2008, SOI Conference, 2 pages.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices, 4 pages.
Han et al., Bulk FinFET Unified-RAM (URAM) Cell for Multifunctioning NVM and Capacitorless 1T-DRAM, IEEE EDL, vol. 29, No. 6, pp. 632-634, Jun. 2008.
Han et al., Partially Depleted SONOS FinFET for Unified RAM (URAM) Unified Function for High-Speed 1T DRAM and Nonvolatile Memory, IEEE EDL, vol. 29, No. 7, pp. 781-783, Jul. 2008.
Han, Energy Band Engineered Unified-RAM (URAM) for Multi-Functioning 1T-DRAM and NVM, Dec. 2008, IEDM, pp. 227-230.
Han, Parasitic BJT Read Method for High-Performance Capacitorless 1T-DRAM Mode in Unified RAM, IEEE EDL, vol. 30, No. 10, pp. 1108-1110, Oct. 2009.
Hara, Y., "Toshiba's DRAM Cell Piggybacks on SOI Wafer", EE Times, Jun. 2003, 1 page.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI, 21 pages.
Jeong et al., "A Capacitor-less 1T Dram Cell Based on a Surrounding Gate MOSFET with a Vertical Channel", Technology Development Team, Technology Development Team, Samsung Electronics Co., Ltd., pp. 92-93, May 2007.
Jeong et al., "A New Capacitorless 1T DRAM Cell: Surrounding Gate MOSFET with Vertical Channel (SGVC Cell)", IEEE Transactions on Nanotechnology, vol. 6, No. 3, May 2007, pp. 352-357.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-136.
Kuo et al., "A Capacitorless Double-Gate DRAM Cell Design for High Density Applications", IEEE IEDM, Feb. 2002, pp. 843-846.

(56) References Cited

OTHER PUBLICATIONS

Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub-100-nm Embedded and Stand-Alone Memory Applications, IEEE Trans. Elec.. Dev., vol. 50, No. 12, pp. 2408-2416, Dec. 2003.
Kwon et al., "A Highly Scalable $4F^2$ DRAM Cell Utilizing a Doubly Gated Vertical Channel", Extended Abstracts of the 2009 International Conference on Solid State Devices and Materials, UC Berkley, p. 142-143, Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI Flash Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25, 10 pages.
Liu, Surface Recombination-Generation Processes of Gate, STI and Buried Oxide Interfaces, Responsible for Junction Leakage on SOI, ICSI, May 19, 2009, 2 pages.
Loncar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, Jun. 2008, IEEE Trans. Elec. Dev., vol. 55, No. 6, pp. 1511-1518.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005 Symposium on VLSI Circuits Digest of Technical Papers, pp. 358-361.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of $6F^2$ Single Cell Operation in Multi Gbit Memories Confirmed by a Newly Developed Method for Measuring Signal Sense Margin, 2007, IEEE, pp. 39-42.
Minami, A Floating Body Cell (FBC) fully Compatible with 90nm CMOS Technology(CMOS IV) for 128Mb SOI DRAM, 2005, IEDM Tech. Digest, pp. 317-320 (4 pages).
Mohapatra et al., Effect of Source/Drain Asymmetry on the Performance of Z-RAM® Devices, Oct. 2009, SOI conference, 2 pages.
Morishita, A Capacitorless Twin-Transistor Random Access Memory (TTRAM) on SOI, 2005, CICC, 4 pages.
Morishita, F. et al., "A Configurable Enhanced TTRAM Macro for System-Level Power Management Unified Memory", IEEE Journal of Solid-State Circuits, vol. 42, No. 4, pp. 853-861, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic Floating Body Control SOI CMOS Circuits for Power Managed Multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003, 2 pages.

Nayfeh, A Leakage Current Model for SOI based Floating Body Memory that Includes the Poole-Frenkel Effect, 2008, SOI Conference, 2 pages.
Nemati, A Novel High Density, Low Voltage SRAM Cell with a Vertical NDR Device, 1998, VLSI Tech. Symp., 2 pages.
Nemati, A Novel Thyristor-based SRAM Cell (T-RAM) for High-Speed, Low-Voltage, Giga-scale Memories, 1999, IEDM Conference, 4 pages.
Nemati, Embedded Volatile Memories-Embedded Tutorial: The New Memory Revolution, New Drives Circuits and Systems, ICCAD 2008, Nov. 2008, San Jose, CA, 23 pages.
Nemati, Fully Planar $0.562\mu m^2$ T-RAM Cell in a 130nm SOI CMOS Logic Technology for High-Density High-Performance SRAMs, 2004, IEDM, 4 pages.
Nemati, Thyristor RAM (T-RAM): A High-Speed High-Density Embedded Memory Technology for Nano-scale CMOS, 2007, Hot Chips Conference, Milpitas, CA, 24 pages.
Nemati, Thyristor-RAM: A Novel Embedded Memory Technology that Outperforms Embedded S RAM/DRAM, 2008, Linley Tech Tour, San Jose, CA, 11 pages.
Nishiguchi et al., Long Retention of Gain-Cell Dynamic Random Access Memory with Undoped Memory Node, IEEE EDL, vol. 28, No. 1, pp. 48-50, Jan. 2007.
Oh, Floating Body DRAM Characteristics of Silicon-On-ONO (SOONO) Devices for System-on-Chip (SoC) Applications, 2007, Symposium on VLSI Technology Digest of Technical Papers, pp. 168-169.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006), 2 pages.
Ohsawa, et al., An 18.5ns 128Mb SOI DRAM with a Floating Body Cell, 2005, ISSCC, pp. 458-459 & 609 (3 pages).
Ohsawa, Autonomous Refresh of Floating Body Cell (FBC), Dec. 2008, IEDM, pp. 801-804.
Ohsawa, Design of a 128-Mb SOI DRAM Using the Floating Body Cell (FBC), IEEE J. Solid-State Circuits, vol. 41, No. 1, Jan. 2006, pp. 135-145.
Okhonin, A Capacitor-Less 1T-DRAM Cell, IEEE Electron Device Letters, vol. 23, No. 2, Feb. 2002, pp. 85-87.
Okhonin, A SOI Capacitor-less 1T-DRAM Concept, pp. 153-154, 2001, SOI Conference.
Okhonin, et al., Charge Pumping Effects in Partially Depleted SOI MOSFETs, 2003, SOI Conference, 2 pages.
Okhonin, et al., New characterization techniques for SOI and related devices, 2003, ECCTD, 1 page.
Okhonin, et al., New Generation of Z-RAM, 2007, IEDM, Lausanne, Switzerland, 3 pages.
Okhonin, Principles of Transient Charge Pumping on Partially Depleted SOI MOSFETs, May 2002, IEEE Electron Device Letters, vol. 23, No. 5, pp. 279-281.
Okhonin, et al., Transient Charge Pumping for Partially and Fully Depleted SOI MOSFETs, 2002, SOI Conference, 2 pages.
Okhonin, Transient effects in PD SOI MOSFETs and potential DRAM applications, 2002, Solid-State Electronics, vol. 46, pp. 1709-1713.
Okhonin, et al., Ultra-scaled Z-RAM cell, 2008, SOI Conference, 2 pages.
Okhonin, Z-RAM® (Limits of DRAM), 2009, ESSDERC, Lausanne, Switzerland, 64 pages.

(56) References Cited

OTHER PUBLICATIONS

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008, pp. 171-174.
Park, Fully Depleted Double-Gate 1T-DRAM Cell with NVM Function for High Performance and High Density Embedded DRAM, 2009, IMW, pp. 32-33.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using Gate-Induced Drain-Leakage (GIDL) Current for High Speed and Low Power applications, 2008, pp. 224-225, SSDM.
Puget et al., Quantum effects influence on thin silicon film capacitor-less DRAM performance, 2006, SOI Conference, 2 pages.
Puget, FDSOI Floating Body Cell eDRAM Using Gate-Induced Drain-Leakage (GIDL) Write Current for High Speed and Low Power Applications, 2009, IMW, pp. 28-29.
Ranica et al., 1T-Bulk DRAM cell with improved performances: the way to scaling, 2005, ICMTD, 4 pages.
Ranica, et al., A capacitor-less DRAM cell on 75nm gate length, 16nm thin Fully Depleted SOI device for high density embedded memories, 2004, IEDM, 4 pages.
Ranica, A One Transistor Cell on Bulk Substrate (1T-Bulk) for Low-Cost and High Density eDRAM, 2004, Symposium on VLSI Technology Digest of Technical Papers, pp. 128-129 (2 pages).
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM: Novel Capacitor-less DRAM Memory, SOI Conference, 2009 IEEE International, Oct. 5-8, 2009 pp. 1-2.
Roy, et al., Thyristor-Based Volatile Memory in Nano-Scale CMOS, 2006, ISSCC, 10 pages.
Sailing et al., Reliability of Thyristor Based Memory Cells, 2009, IRPS, 7 pages.
Sasaki et al., Charge Pumping in SOS-MOS Transistors, IEEE Trans. Elec. Dev., vol. ED-28, No. 1, Jan. 1981, pp. 48-52.
Sasaki et al., Charge Pumping SOS-MOS Transistor Memory, 1978, IEDM, pp. 356-359 (4 pages and clear graph of Fig. 10).
Schloesser et al., "A $6F^2$ Buried Wordline DRAM Cell for 40nm and Beyond", IEEE, Qimonda Dresden GmbH & Co., pp. 809-812 (2008).
Shino et al., Floating Body RAM Technology and its Scalability to 32nm Node and Beyond, 2006, IEDM, 4 pages.
Shino et al., Operation Voltage Dependence of Memory Cell Characteristics in Fully Depleted Floating Body Cell, IEEE Trans. Elec. Dev., vol. 25, No. 10, Oct. 2005, pp. 2220-2226.
Shino, et al., Fully-Depleted FBC (Floating Body Cell) with Enlarged Signal Window and Excellent Logic Process Compatibility, 2004, IEDM, 4 pages.
Shino, et al. Highly Scalable FBC (Floating Body Cell) with 25nm BOX Structure for Embedded DRAM Applications, 2004, Symposium on VLSI Technology, pp. 132-133 (2 pages).
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, et al., A 2ns-Read-Latency 4Mb Embedded Floating-Body Memory Macro in 45nm SOI Technology, Feb. 2009, ISSCC, 3 pages.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, et al., 55 nm Capacitor-less 1T DRAM Cell Transistor with Non-Overlap Structure, Dec. 2008, IEDM, pp. 797-800.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.
Tanaka et al., "Scalability Study on a Capacitorless 1T-DRAM: From Single-gate PD-SOI to Double-gate FINDRAM", 2004 IEEE, 4 pages.
Tang, et al., Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15 μm SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on $SiO_2$ ", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (2 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, IEEE Trans. Elec. Dev., vol. 52, No. 11, Nov. 2005, pp. 2447-2454.
Wang et al., A Novel $4.5F^2$ Capacitorless Semiconductor Memory Device, 2008, IEEE EDL, pp. 1-2.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

(56) References Cited

OTHER PUBLICATIONS

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, et al., Optimization of Nanoscale Thyristors on SOI for High-Performance High-Density Memories, 2006, SOI Conference, 2 pages.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using Gate-Induced Drain-Leakage (GIDL) Current for Low Power and High Speed Embedded Memory, IEEE Trans. Elec. Dev., vol. 53, No. 4, Apr. 2006, pp. 692-697.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in Silicon-On-ONO (SOONO) Device for the Capacitor-less RAM Applications, 2007, SOI Conference, 2 pages.

Zhou, Physical Insights on BJT-Based 1T DRAM Cells, IEEE Electron Device Letters, vol. 30, No. 5, May 2009, pp. 565-567.

\* cited by examiner

SEMICONDUCTOR DEVICE WITH FLOATING GATE AND ELECTRICALLY FLOATING BODY

CROSS-REFERENCE TO RELATED APPLICATIONS

This patent application is a continuation of U.S. patent application Ser. No. 13/964,777, filed Aug. 12, 2013, now U.S. Pat. No. 8,792,276, issued Jul. 29, 2014, which is a continuation of U.S. patent application Ser. No. 12/770,249, filed Apr. 29, 2010, now U.S. Pat. No. 8,508,994, issued Aug. 13, 2013, which claims priority to U.S. Provisional Patent Application No. 61/174,075, filed Apr. 30, 2009, each of which is hereby incorporated by reference herein in its entirety.

FIELD OF THE DISCLOSURE

The present disclosure relates to a semiconductor device, architecture, memory cell, array, and techniques for controlling and/or operating such device, cell, and array. More particularly, in one aspect, the present disclosure relates to a memory cell, array, architecture and device, wherein the memory cell includes a floating gate and an electrically floating body configured or operated to store an electrical charge.

BACKGROUND OF THE DISCLOSURE

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD) devices, fully depleted (FD) devices, multiple gate devices (for example, double or triple gate), and Fin-FET.

One type of dynamic random access memory cell is based on, among other things, the electrically floating body effect of SOI transistors; see, for example, U.S. Pat. No. 6,969,662 (the "'662 patent"). In this regard, the dynamic random access memory cell may consist of a PD or a FD SOI transistor (or transistor formed in bulk material/substrate) having a channel, which is disposed adjacent to the body and separated from the channel by a gate dielectric. The body region of the transistor is electrically floating in view of the insulation layer (or non-conductive region, for example, in a bulk-type material/substrate) disposed beneath the body region. The state of the memory cell is determined by the concentration of charge within the body region of the SOI transistor.

Data is written into or read from a selected memory cell by applying suitable control signals to a selected word line(s), a selected source line(s) and/or a selected bit line(s). In response, charge carriers are accumulated in or emitted and/or ejected from electrically floating body region wherein the data states are defined by the amount of carriers within electrically floating body region. Notably, the entire contents of the '662 patent, including, for example, the features, attributes, architectures, configurations, materials, techniques and advantages described and illustrated therein, are incorporated by reference herein.

Referring to the operations of an N-channel transistor, for example, the memory cell of a DRAM array operates by accumulating in or emitting/ejecting majority carriers (electrons or holes) from body region. In this regard, conventional write techniques may accumulate majority carriers (in this example, "holes") in body region of memory cells by, for example, impact ionization near source region and/or drain region. In sum, conventional writing programming techniques for memory cells having an N-channel type transistor often provide an excess of majority carriers by impact ionization or by band-to-band tunneling (gate-induced drain leakage ("GIDL")). The majority carriers may be emitted or ejected from body region by, for example, forward biasing the source/body junction and/or the drain/body junction, such that the majority carrier may be removed via drain side hole removal, source side hole removal, or drain and source hole removal, for example.

Notably, for at least the purposes of this discussion, a logic high data state, or logic "1", corresponds to, for example, an increased concentration of majority carries in the body region relative to an unprogrammed device and/or a device that is programmed with logic low data state, or logic "0". In contrast, a logic low data state, or logic "0", corresponds to, for example, a reduced concentration of majority carriers in the body region relative to a device that is programmed with a logic high data state, or logic "1". The terms "logic low data state" and "logic 0" may be used interchangeably herein; likewise, the terms "logic high data state" and "logic 1" may be used interchangeably herein.

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines to enable the reading of the memory cells associated with such word lines. The amount of drain current is determined or affected by the charge stored in the electrically floating body region of the transistor. As such, conventional reading techniques sense the amount of channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

Further to writing and reading data to memory cells, data stored in the memory cells is required, under certain circumstances, to be periodically refreshed as a result of leakage current. The refreshing of the memory generally involves periodically reading information or data from an area of the memory (e.g., memory cells), and subsequently rewriting the read information into the same area of memory (e.g., memory cells) from which it was read with no modifications. Conventional refreshing techniques thus use the read and write operations appropriate to the transistor, and perform the read and write during two or more separate clock cycles. The technique used for refreshing data in a dynamic memory can have a large impact on memory performance, including memory availability, die area, and power consumption. Memories are typically and more specifically refreshed by performing a read operation during which data is read from memory cells into sense amps, followed by a write operation during which data is written back into the memory cells.

Conventional solutions to improve memory availability have typically involved increasing the number of sense amps in the memory so more of the memory can be refreshed at the same time. Unfortunately, the addition of more sense amps increases memory die area. Additionally, conventional refresh techniques often lead to relatively large power consumption due to, for example, the separate read and write operations of the refresh.

In view of the foregoing, it may be understood that there may be significant problems and shortcomings associated with current floating body memory technologies.

SUMMARY OF THE DISCLOSURE

Techniques for providing floating body memory devices are disclosed. In one particular exemplary embodiment, the techniques may be realized as a semiconductor device comprising a floating gate, a control gate disposed over the floating gate, a body region that is electrically floating, wherein the body region is configured so that material forming the body region is contained under at least one lateral boundary of the floating gate, and a source region and a drain region adjacent the body region.

In another particular exemplary embodiment, the techniques may be realized as a semiconductor device comprising a floating gate, a control gate disposed over the floating gate, a body region that is electrically floating, wherein the body region is configured so that material forming the body region extends beyond at least one lateral boundary of the floating gate, and a source region and a drain region adjacent the body region.

In another particular exemplary embodiment, the techniques may be realized as a semiconductor device comprising a control gate, a floating gate partially disposed under the control gate, a body region partially disposed under the floating gate, wherein the body region is electrically floating, and a source region and a drain region adjacent the body region, wherein one or more of the source region and the drain region include a doped region shaped so that a farthermost boundary of the doped region is separated from a portion of the body region underlying the floating gate.

In another particular exemplary embodiment, the techniques may be realized as a semiconductor device comprising a body region configured to be electrically floating, a floating gate disposed over a first portion of the body region, a control gate disposed over the floating gate, a source region adjoining a second portion of the body region, wherein the second portion is adjacent the first portion and separating the source region from the first portion, and a drain region adjoining a third portion of the body region, wherein the third portion is adjacent the first portion and separating the drain region from the first portion.

In another particular exemplary embodiment, the techniques may be realized as a transistor comprising a floating body region on a insulating substrate, a floating gate disposed over a portion of the floating body region, and a source region and a drain region, wherein a doping profile of one or more of the source and the drain region is configured to prevent formation of a contiguous current channel extending between the source region and the drain region through the floating body region.

In another particular exemplary embodiment, the techniques may be realized as a method for forming a transistor, comprising forming a semiconductor on an insulator, forming a first gate over a first portion of the semiconductor and electrically isolating the first gate from the semiconductor, forming a second gate over a portion of the first gate and electrically isolating the second gate from the first gate, forming spacers over a second portion and a third portion of the semiconductor, wherein the spacers adjoin the insulating layer and the first portion, second portion, and third portion form a floating body region, forming a source region by implanting an impurity into a fourth portion of the semiconductor after forming the spacers, wherein the fourth portion is adjacent the second portion, and forming a drain region by implanting the impurity into a fifth portion of the semiconductor after forming the spacers, wherein the fifth portion is adjacent the third portion.

In another particular exemplary embodiment, the techniques may be realized as a semiconductor circuit device produced by a method comprising forming a semiconductor on an insulator, forming a first gate over a first portion of the semiconductor and electrically isolating the first gate from the semiconductor, forming a second gate over a portion of the first gate and electrically isolating the second gate from the first gate, forming spacers over a second portion and a third portion of the semiconductor, wherein the spacers adjoin the insulating layer and the first portion, second portion, and third portion form a floating body region, forming a source region by implanting an impurity into a fourth portion of the semiconductor after forming the spacers, wherein the fourth portion is adjacent the second portion, forming a drain region by implanting the impurity into a fifth portion of the semiconductor after forming the spacers, wherein the fifth portion is adjacent the third portion.

In another particular exemplary embodiment, the techniques may be realized as a semiconductor device comprising a body region, wherein the body region is electrically floating, a gate disposed over a first portion of the body region, wherein the gate is electrically floating, a source region adjoining a second portion of the body region, wherein the second portion is adjacent the first portion and separating the source region from the first portion, and a drain region adjoining a third portion of the body region, wherein the third portion is adjacent the first portion and separating the drain region from the first portion.

In another particular exemplary embodiment, the techniques may be realized as an integrated circuit device comprising a memory cell including a transistor, wherein the transistor comprises a body region configured to be electrically floating, a floating gate disposed over a first portion of the body region, a control gate disposed over the floating gate, a source region adjoining a second portion of the body region, wherein the second portion is adjacent the first portion and separating the source region from the first portion, and a drain region adjoining a third portion of the body region, wherein the third portion is adjacent the first portion and separating the drain region from the first portion, and control circuitry coupled to the memory cell, wherein the control circuitry to apply a first signal set to the memory cell to cause the memory cell to operate as a non-volatile memory cell, wherein the control circuitry to apply a second signal set to the memory cell to cause the memory cell to operate as a volatile memory cell.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In the course of the detailed description to follow, reference will be made to the attached drawings. These drawings show different aspects of the present disclosure and, where appropriate, reference numerals illustrating like structures, components, materials and/or elements in different figures are labeled similarly. It is understood that various combinations of the structures, components, materials and/or elements, other than those specifically shown, are contemplated and are within the scope of the present disclosure.

Moreover, there are many aspects of the present disclosure described and illustrated herein. The present disclosure is not limited to any single aspect or embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, many of those permutations and combinations will not be discussed separately herein.

DETAILED DESCRIPTION OF EXEMPLARY EMBODIMENTS

There are many aspects of the present disclosure described herein as well as many embodiments of those aspects. In one aspect, the present disclosure may be directed to a semiconductor device including a floating gate and an electrically floating body. In another aspect, the present disclosure may be directed to techniques to control and/or operate a semiconductor memory cell (and memory cell array having a plurality of such memory cells as well as an integrated circuit device including a memory cell array) having one or more transistors having a floating gate and an electrically floating body in which an electrical charge is stored in the floating gate or the electrically floating body (according to the mode of operation of the transistor).

The present disclosure may also be directed to semiconductor memory cells, arrays, circuitry and devices to implement such control and operation techniques. Notably, the memory cell and/or memory cell array may comprise a portion of an integrated circuit device, for example, logic device (such as, a microcontroller or microprocessor) or a portion of a memory device (such as, a discrete memory).

Figure 1A:
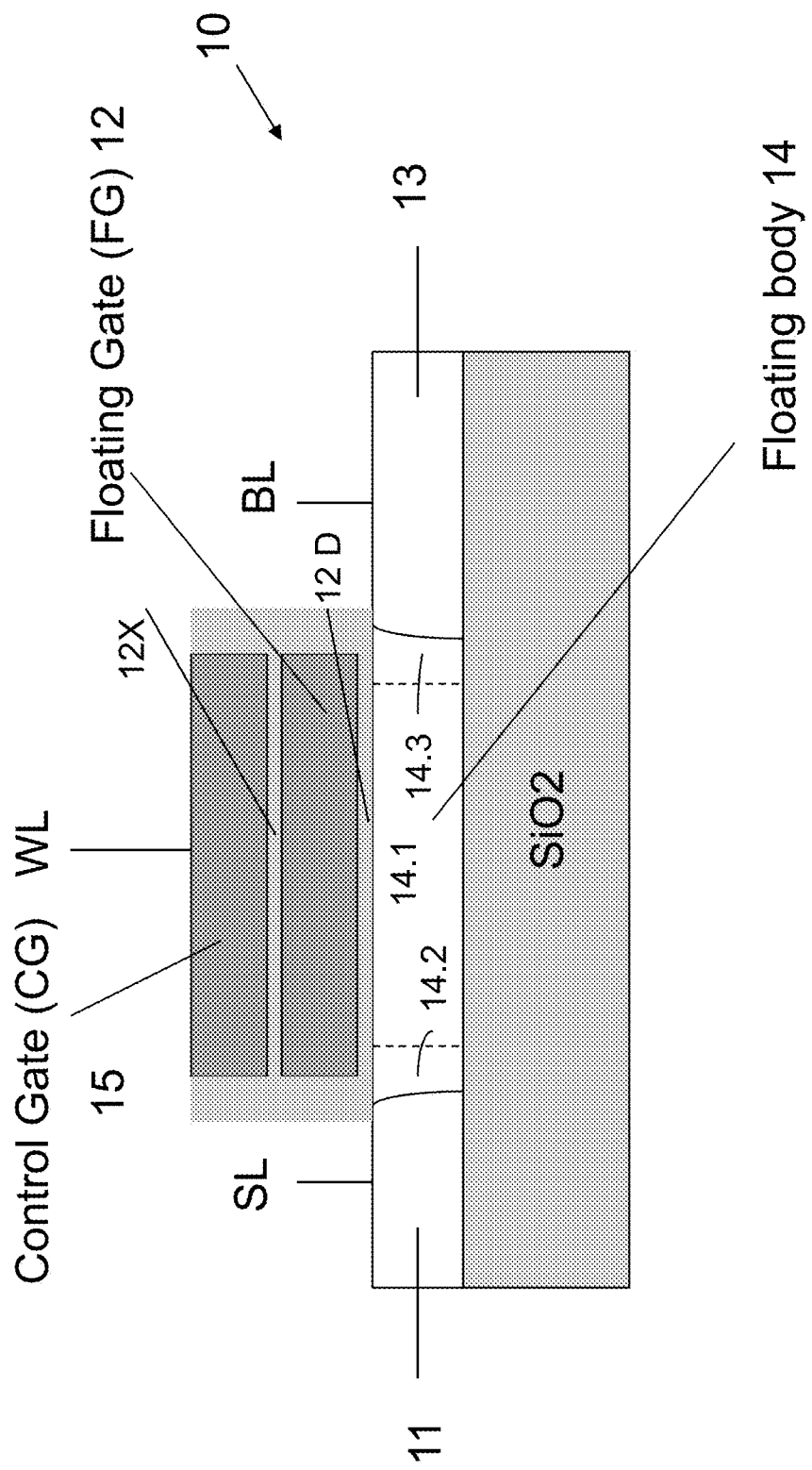
FIG. 1A shows a floating gate transistor in accordance with an embodiment of the present disclosure.

FIG. 1A shows a floating gate transistor 10 in accordance with an embodiment of the present disclosure. The transistor 10 includes a floating gate 12 and a body region 14 configured to be electrically floating. The body region 14 includes three portions or regions 14-1/14-2/14-3 that collectively define the electrically floating body 14. Each of the three regions 14-1/14-2/14-3 of the body comprises the same or similar material (e.g., p-type material, n-type material, etc.). The transistor 10 includes a floating gate 12 disposed over the body region 14.

The floating body region 14 of the floating gate transistor 10 includes a source region 11 adjoining a second portion 14-2 of the body region 14; the second portion 14-2 of the body region is adjacent the first portion 14-1 and separates the source region 11 from the first portion 14-1. A drain region 13 adjoins a third portion 14-3 of the body region 14; the third portion 14-3 of the body region is adjacent the first portion 14-1 and separates the drain region 13 from the first portion 14-1. The source region 11 and/or drain region 13 is created using conventional doping or implantation techniques but is not so limited. The second portion 14-2 and third portion 14-3 of the body region function to electrically "disconnect" (e.g., disconnect any charge that may accumulate, disconnect any inversion channel that may form) in the first portion 14-1 from one or more of the source 11 and the drain 13 as described in detail below.

The transistor 10 of an embodiment includes a floating gate 12 disposed over the body region 14, as described above. The floating gate 12 of an embodiment is disposed over the first portion 14-1 of the body region 14 and, additionally, some portion of the second 14-2 and third 14-3 portions of the body region. Generally, the floating gate 12 comprises a gate dielectric 12D and a dielectric 12X. The gate dielectric 12D is positioned between the floating gate 12 and the floating body region 14. The oxide 12X isolates the floating gate 12 from the control gate 15 so that the floating gate of this transistor is electrically isolated from other components of the device (i.e. no resistive connections are formed to the floating gate 12). Because dielectric surrounds the floating gate 12, any charge trapped on the floating gate 12 remains on the floating gate 12. The charge stored on the floating gate 12 can be modified by applying voltages to terminals of the source 11, drain 13, body 14 and control gate 15, such that the fields result in phenomena like hot carrier injection and Fowler-Nordheim tunneling (referred to herein as "tunneling"), as described in detail below.

Data is written into, read from, or refreshed in a selected transistor 10 by application of suitable control signals. Control signals are coupled to the transistor 10 through one of more of a source line SL, a bit line BL, and a word line WL. In an embodiment, the control gate of a transistor 10 of an embodiment is connected to a word line WL, the source region 11 is connected to a source line SL, and the drain region 13 is connected to a bit line BL, but the embodiment is not so limited. In response to the control signals, charge carriers are accumulated in or emitted and/or ejected from the floating gate 12 and/or the electrically floating body region 14 wherein the data states are defined by the amount of carriers within the floating gate 12 and/or the electrically floating body region 14.

The floating gate transistor 10 of an embodiment can function as a flash memory device. Furthermore, the floating gate transistor 10 can also function as a dynamic random access (DRAM) memory device. Operations of the floating gate transistor 10 as a flash memory device and a DRAM device are described in detail below.

Figure 1B:
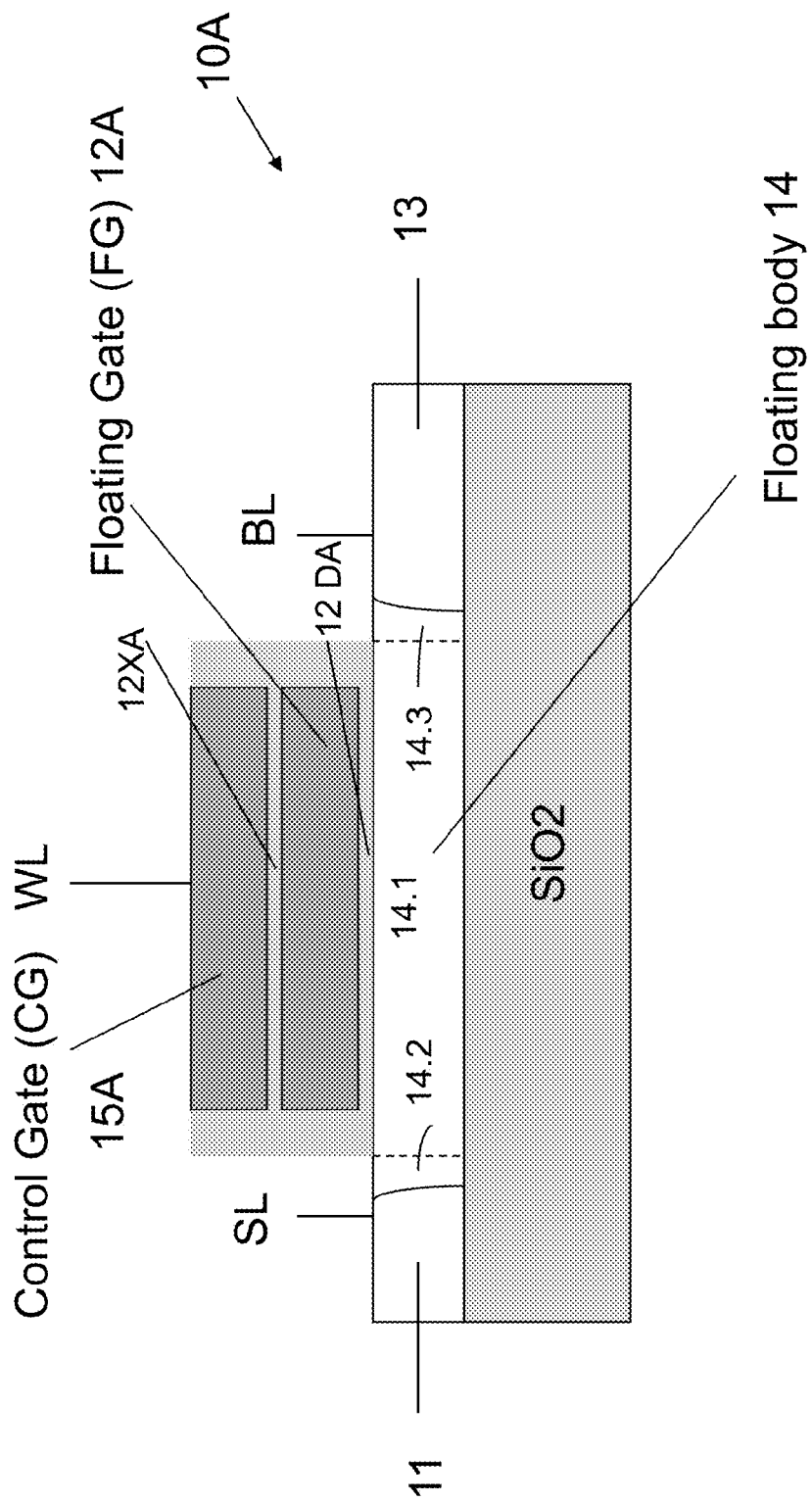
FIG. 1B shows a floating gate transistor in accordance with an embodiment of the present disclosure.

FIG. 1B shows a floating gate transistor 10A in accordance with an embodiment of the present disclosure. The transistor 10A includes a floating gate 12A and a body region 14 configured to be electrically floating. The body region 14 includes three portions or regions 14-1/14-2/14-3 that collectively define the electrically floating body 14. Each of the three regions 14-1/14-2/14-3 of the body comprises the same or similar material (e.g., p-type material, n-type material, etc.). The transistor 10A includes a floating gate 12A disposed over the body region 14.

The floating gate 12A of this alternative embodiment is disposed over the first portion 14-1 of the body region 14. The floating gate 12A generally comprises a gate dielectric 12DA and a dielectric 12XA. The gate dielectric 12DA is positioned between the floating gate 12A and the first portion 14-1 of the floating body region 14. The oxide 12XA isolates the floating gate 12A from the control gate 15A so that the floating gate 12A of this transistor is electrically isolated from other components of the device. Because dielectric surrounds the floating gate 12A, any charge trapped on the floating gate 12A remains on the floating gate 12A. The charge stored on the floating gate 12A can be modified by applying voltages to terminals of the source 11, drain 13, body 14 and control gate 15A, as described in detail herein.

Data is written into, read from, or refreshed in a selected transistor 10A by application of suitable control signals. Control signals are coupled to the transistor 10A through one of more of a source line SL, a bit line BL, and a word line WL. In an embodiment, the control gate of a transistor 10A of an embodiment is coupled to a word line WL, the source region 11 is coupled to a source line SL, and the drain region 13 is coupled to a bit line BL, but the embodiment is not so limited. In response to the control signals, charge carriers are accumulated in or emitted and/or ejected from the floating gate 12A and/or the electrically floating body region 14 wherein the data states are defined by the amount of carriers within the floating gate 12A and/or the electrically floating body region 14.

The floating gate transistor 10A of an embodiment can function as a flash memory device. Furthermore, the floating gate transistor 10A can also function as a dynamic random access (DRAM) memory device. Operations of the floating gate transistor 10A as a flash memory device and a DRAM device are described in detail below.

The floating gate of an embodiment generally comprises a floating gate 12 at least partially surrounded by oxide 12X, as described above. The oxide 12X isolates the floating gate 12 from the control gate 15 so that the floating gate of the host transistor is electrically isolated from other components of the device (i.e. no resistive connections are formed to the floating gate 12. The gate oxide of an alternative transistor embodiment can comprise silicon nitride ($Si_3N_4$) inserted inside the gate oxide, thereby forming a Silicon-Oxide-Nitride-Oxide-Silicon (SONOS) memory device. The nitride is non-conductive but contains a large number of charge trapping sites able to hold an electrostatic charge. The nitride layer is electrically isolated from the surrounding transistor, although charges stored on the nitride directly affect the conductivity of the underlying transistor channel. The oxide/nitride sandwich can comprise, for example, a 2 nm thick oxide lower layer, a 5 nm thick silicon nitride middle layer, and a 5-10 nm oxide upper layer. With the exception of the gate oxide, all other aspects of the SONOS memory device are as described above with reference to FIGS. 1A and 1B.

The gate oxide of yet another alternative transistor embodiment can comprise high-k dielectric (Hi-k) Nitride inserted inside the gate oxide. This combination forms a Silicon Hi-k Nitride Oxide Silicon (SHINOS) memory device. With the exception of the gate oxide, all other aspects of the SHINOS memory device are as described above with reference to FIGS. 1A and 1B.

Figure 2:
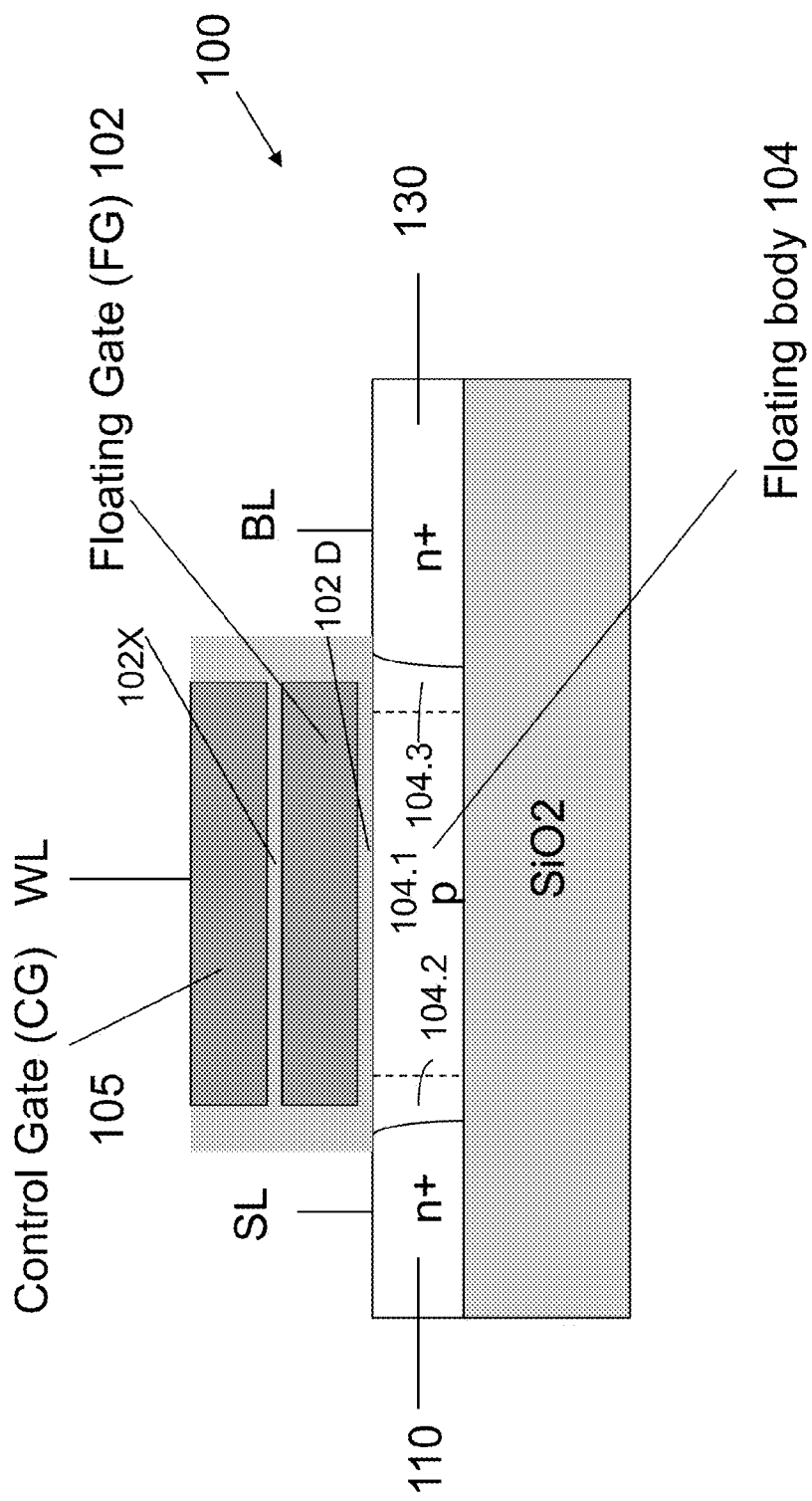
FIG. 2 shows a floating gate transistor in accordance with an embodiment of the present disclosure.

More specifically, FIG. 2 shows a floating gate transistor 100 in accordance with an embodiment of the present disclosure. The transistor 100 includes a floating gate 102 and a body region 104 configured to be electrically floating. The body region 104 includes three portions or regions 104-1/104-2/104-3 that collectively define the electrically floating body 104. Each of the three regions 104-1/104-2/104-3 of the body comprises the same or similar material (e.g., P-type in this example). In this embodiment the floating body region 104 comprises p-type material and the source and drain regions both comprise n-type material; alternative embodiments can include a floating body region 104 comprising n-type material and source and drain regions both comprising p-type material. The transistor 100 includes a floating gate 102 disposed over the three regions 104-1/104-2/104-3 that collectively define the electrically floating body 104 (e.g., FIG. 1A), but the embodiment is not so limited as described above, such that the floating gate can be disposed only over the first portion 104-1 of the body region 104 (e.g., FIG. 1B).

The floating body region 104 of the floating gate transistor 100 includes a source region 110 adjoining a second portion 104-2 of the body region 104; the second portion 104-2 of the body region is adjacent the first portion 104-1 and separates the source region 110 from the first portion 104-1. A drain region 130 adjoins a third portion 104-3 of the body region 104; the third portion 104-3 of the body region is adjacent the first portion 104-1 and separates the drain region 130 from the first portion 104-1. The source region 110 and/or drain region 130 is created using conventional doping or implantation techniques but is not so limited. The second portion 104-2 and third portion 104-3 of the body region function to electrically "disconnect" (e.g., disconnect any charge that may accumulate, disconnect any inversion channel that may form) in the first portion 104-1 from one or more of the source 110 and the drain 130 as described in detail below.

The floating gate 102 of an embodiment is disposed over the first portion 104-1 of the body region 104. The floating gate 102 comprises a gate dielectric 102D and a dielectric 102X. The gate dielectric 102D is positioned between the floating gate 102 and the floating body region 104. The oxide 102X isolates the floating gate 102 from the control gate 105 so that the floating gate of this transistor is electrically isolated from other components of the device (i.e. no resistive connections are formed to the floating gate 102). Because dielectric surrounds the floating gate, any charge trapped on the floating gate 102 remains on the floating gate 102. The charge stored on the floating gate 102 can be modified by applying voltages to terminals of the source 110, drain 130, body 104 and control gate 105, such that the fields result in phenomena like hot carrier injection and Fowler-Nordheim tunneling (referred to herein as "tunneling"), as described in detail below.

The floating gate transistor 100 of an embodiment can function as a flash memory device. Furthermore, the floating gate transistor 100 can also function as a dynamic random access (DRAM) memory device. Operation of the floating gate transistor 100 is as a flash memory device or a DRAM device is described in detail below. The operational examples that follow below make reference to an N-channel transistor 100 that includes a floating gate disposed over the three regions that collectively define the electrically floating body (e.g., FIG. 1A); it is understood, however, that the examples are not so limited as described above, and the floating gate can be disposed only over the first portion of the body region (e.g., FIG. 1B).

Figure 3:
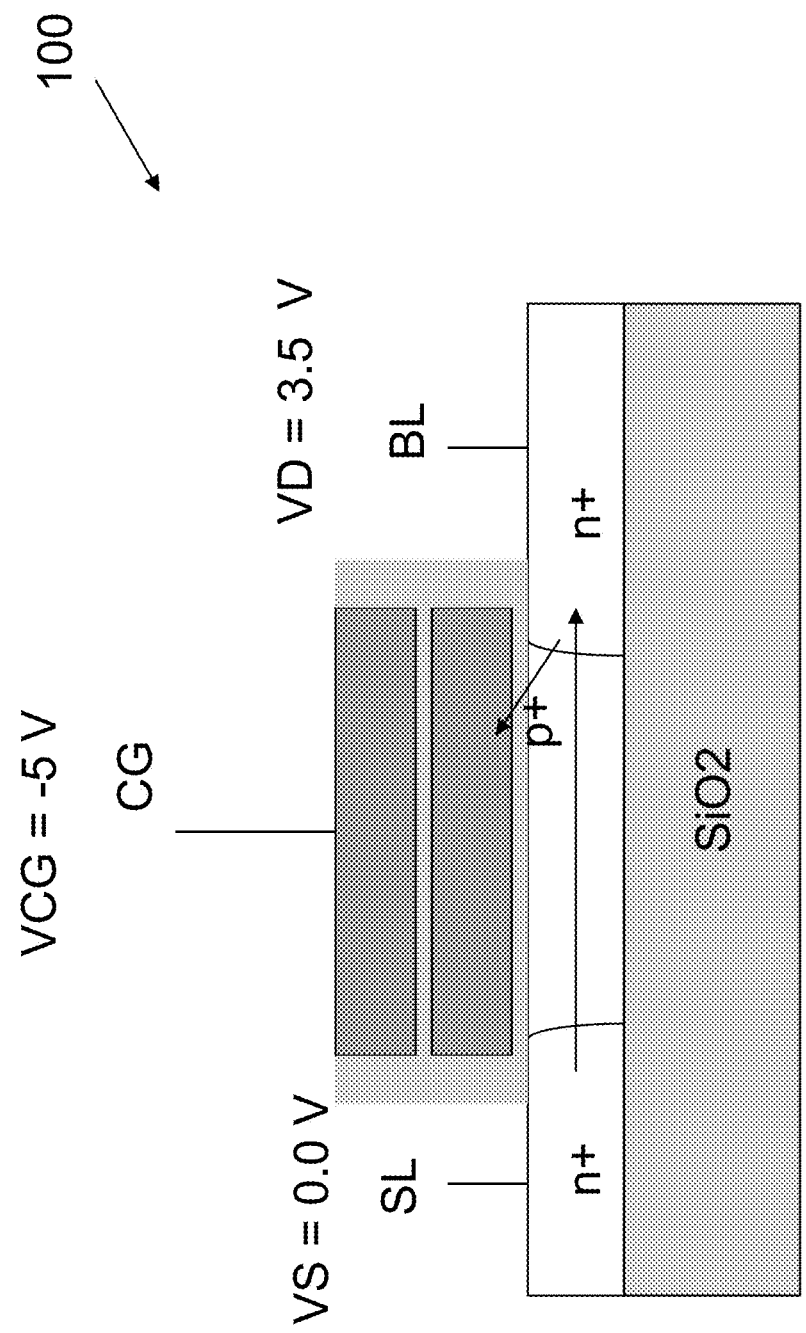
FIG. 3 shows operation of the transistor as a flash memory device when writing or programming logic "1" using hot hole injection in accordance with an embodiment of the present disclosure.

FIG. 3 shows operation of the transistor 100 as a flash memory device when writing or programming logic "1" using hot hole injection in accordance with an embodiment of the present disclosure. The transistor 100 of this embodiment is an N-channel or nMOS FET, as described above, but is not so limited (e.g., transistor 100 may be a P-channel or pMOS FET in an alternative embodiment). The N-channel device includes source 110 and drain 120 regions comprising N+-type material while the body region 104 comprises a P-type material.

A logic "1" programming operation of an embodiment of the transistor operating as a flash memory device is carried out using hot hole injection through the application of control signals. Control signals having predetermined voltages (for example, Vg=−5 v, Vs=0.0 v, and Vd=3.5 v) are applied to the control gate, source region 110 and drain region 120 (respectively) of transistor 100. The control signals result in an accumulation of minority carriers in the electrically floating body 104. The minority carriers of the body region 104 accumulate in the first portion 104-1 of the body region 104. The minority carriers may accumulate in an area of the first portion 104-1 under the floating gate 102, but are not so limited.

The control signals also result in a source current in the electrically floating body region 104 of transistor 100. More specifically, the potential difference between the source voltage and the drain voltage (e.g., 3.5 volts) is greater than the threshold required to turn on the bipolar transistor 100. Therefore, source current of the transistor 100 causes or produces impact ionization and/or the avalanche multiplication phenomenon among particles (accumulated minority carriers) in the electrically floating body region 104. The impact ionization produces, provides, and/or generates an excess of majority carriers (not shown) in the electrically floating body region 104 of transistor 100. The source current responsible for impact ionization and/or avalanche multiplication in the electrically floating body region 104 is initiated or induced by the control signal applied to gate 102 of transistor 100 along with the potential difference between the source 110 and drain 120 regions. Such a control signal may induce channel impact ionization which raises or increases the potential of body region 104 and "turns on", produces, causes and/or induces a source current in transistor 100.

The magnitude of the control signals applied to the control gate, source 110, and drain 120 result in a charge being stored on the floating gate 102 as a result of hot carrier injection from the body region 104 that is in the "on" state. Hot carrier injection is the phenomenon in solid-state devices or semiconductors where a majority carrier (e.g., "holes") gains sufficient kinetic energy to overcome a potential barrier, becoming a "hot carrier", and then migrates to a different area of the device. More particularly, in this embodiment, the hot carrier gains sufficient kinetic energy to overcome the potential barrier of the body region 104, and then migrates from the body region 104 through the gate oxide to the floating gate. In this device, "hot carrier" therefore refers to the effect where the majority carrier (e.g., "holes") is injected from the floating body region 104 to the floating gate 102 (not shown on FIG. 3). As a result of the polarity (e.g., negative) of the control signal applied to the floating gate 102, majority carriers that gain sufficient kinetic energy to become "hot" enter the valence band of the dielectric from the first portion 104-1 of the body 104 and accumulate on the floating gate 102.

The majority carriers, once injected from the floating body region 104, reside at the floating gate 102 where in memory terms they represent a "1", or logic high state, until such time as the memory is erased, and the majority carrier is removed from the floating gate 102. Thus, in this embodiment, the predetermined voltages of the applied control signals program or write logic "1" in the transistor 100 via impact ionization and avalanche multiplication in the electrically floating body region 104, and hot carrier injection from the floating body region 104 to the floating gate 102.

Figure 4:
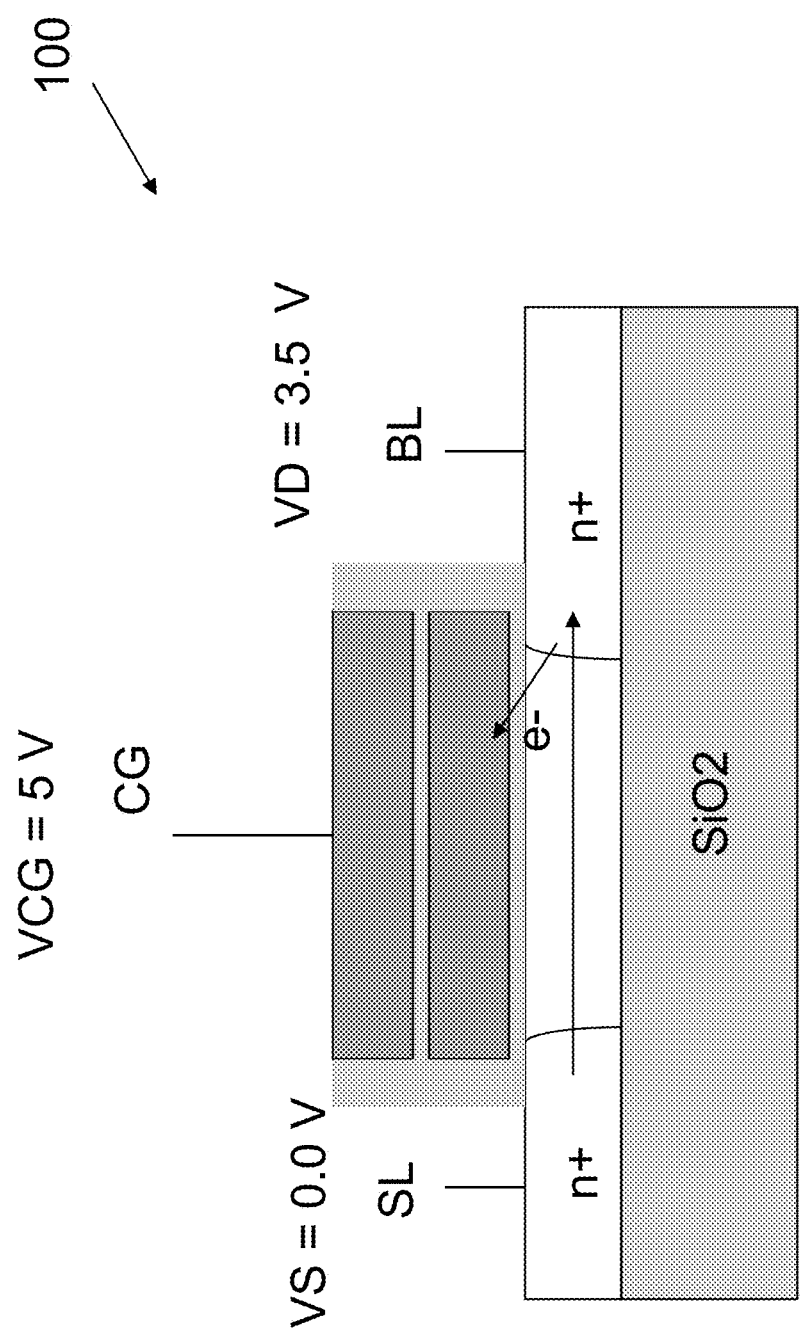
FIG. 4 shows operation of the transistor as a flash memory device when writing or programming logic "0" using hot electron injection in accordance with an embodiment of the present disclosure.

FIG. 4 shows operation of the transistor 100 as a flash memory device when writing or programming logic "0" using hot electron injection in accordance with an embodiment of the present disclosure. The transistor 100 of this embodiment is an N-channel or nMOS FET, as described above, but is not so limited (e.g., transistor 100 may be a P-channel or pMOS FET in an alternative embodiment). The N-channel device includes source 110 and drain 120 regions comprising N+-type material while the body region 104 comprises a P-type material.

A logic "0" programming operation of an embodiment of the transistor operating as a flash memory device is carried out using hot electron injection through the application of control signals. Control signals having predetermined voltages (for example, Vg=5 v, Vs=0.0 v, and Vd=3.5 v) are applied to the control gate, source region 110 and drain region 120 (respectively) of transistor 100. The control signals result in an accumulation of minority carriers in the electrically floating body 104. The minority carriers of the body region 104 accumulate in the first portion 104-1 of the body region 104. The minority carriers may accumulate in an area of the first portion 104-1 under the floating gate 102, but are not so limited.

The control signals also result in a source current in the electrically floating body region 104 of transistor 100. More specifically, the potential difference between the source voltage and the drain voltage (e.g., 3.5 volts) is greater than the threshold required to turn on the bipolar transistor 100. Therefore, source current of the transistor 100 causes or produces impact ionization and/or the avalanche multiplication phenomenon among particles (accumulated minority carriers) in the electrically floating body region 104. The impact ionization produces, provides, and/or generates an excess of majority carriers in the electrically floating body region 104 of transistor 100. The source current responsible for impact ionization and/or avalanche multiplication in the electrically floating body region 104 is initiated or induced by the control signal applied to gate 102 of transistor 100 along with the potential difference between the source 110 and drain 120 regions. Such a control signal may induce channel impact ionization which raises or increases the potential of body region 104 and "turns on", produces, causes and/or induces a source current in transistor 100.

The magnitude of the control signals applied to the control gate, source 110, and drain 120 result in a charge being stored on the floating gate 102 as a result of hot carrier injection from the body region 104 that is in the "on" state. In this embodiment, the hot carrier gains sufficient kinetic energy to overcome the potential barrier of the body region 104, and then migrates from the body region 104 through the oxide 102X to the gate dielectric 102D. In the device of this embodiment, "hot carrier" therefore refers to the effect where the minority carrier (e.g., "electrons") is injected from the floating body region 104 to control gate. As a result of the polarity (e.g., positive) of the control signal applied to the control gate, majority carriers that gain sufficient kinetic energy to become "hot" and enter the conduction band of the dielectric from the first portion 104-1 of the body 104 accumulate in the gate dielectric 102D and, thus, on the floating gate 102. The minority carriers, or electrons, once injected from the floating body region 104 to the gate dielectric 102D, reside at the floating gate 102 where in memory terms they represent a "0", or logic low state, until such time as the memory is erased, and the majority carrier is removed from the floating gate 102. Thus, in this embodiment, the predetermined voltages of the applied control signals program or write logic "0" in the transistor 100 via impact ionization and avalanche multiplication in the electrically floating body region 104, and hot carrier injection from the floating body region 104 to the floating gate 102.

Figure 5:
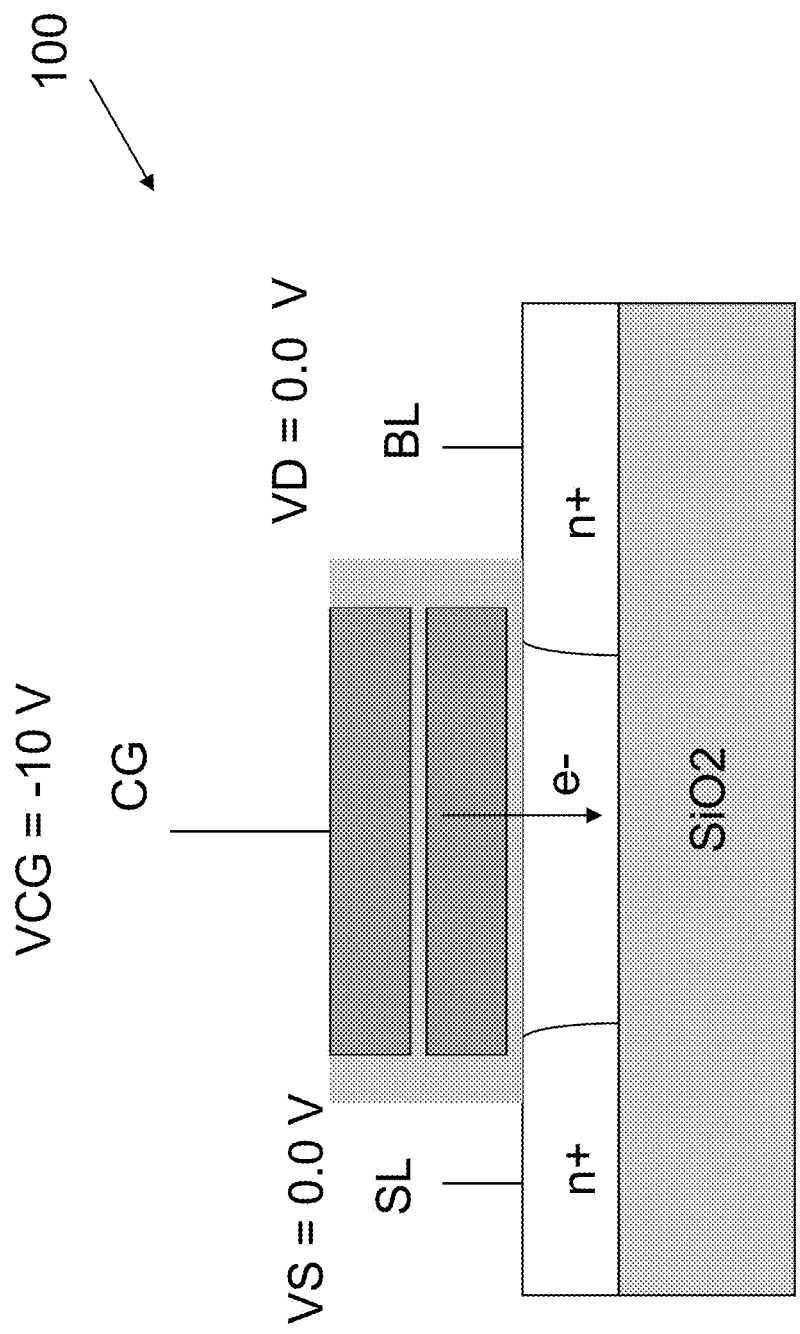
FIG. 5 shows operation of the transistor as a flash memory device when writing or programming logic "1" using electron tunneling in accordance with an embodiment of the present disclosure.

FIG. 5 shows operation of the transistor 100 as a flash memory device when writing or programming logic "1" using electron tunneling in accordance with an embodiment of the present disclosure. The transistor 100 of this embodiment is an N-channel or nMOS FET, as described above, but is not so limited (e.g., transistor 100 may be a P-channel or pMOS FET in an alternative embodiment). The N-channel device includes source 110 and drain 120 regions comprising N+-type material while the body region 104 comprises a P-type material.

A logic "1" programming operation of an embodiment of the transistor operating as a flash memory device is carried out using electron tunneling through the application of control signals. Control signals having predetermined voltages (for example, Vg=-10 v, Vs=0.0 v, and Vd=0.0 v) are applied to gate 102, source region 110 and drain region 120 (respectively) of transistor 100. The control signals prevent source current from flowing in the electrically floating body region 104 of transistor 100. More specifically, the potential difference between the source voltage and the drain voltage (e.g., 0 volts) is less than the threshold required to turn on the bipolar transistor 100. Therefore, the transistor remains in an "off" state such that no source current is produced and/or induced in transistor 100.

Tunneling, also referred to as Fowler-Nordheim tunneling, is a process in which electrons are transported through a barrier and results in alteration of the placement of electrons in the floating gate. In addition to the effect of the control signals applied to the source and drain of the transistor 100, as described above, the electrical charge applied to the floating gate causes the floating gate transistor 100 to act like an electron gun. As a result of the polarity (e.g., negative) of the control signal applied to the floating gate, the electrons of the floating gate are pushed through, thus removing negative charge from the floating gate. The floating gate is positively charged as a result of removal of the negative charge, and the resultant positive charge residing at the floating gate 102 represents, in memory terms, a "1", or logic high state, until such time as the memory is erased. Thus, in this embodiment, the predetermined voltages of the applied control signals program or write logic "1" in the transistor 100 via electron tunneling from the floating gate 102 to the floating body region 104.

Figure 6:
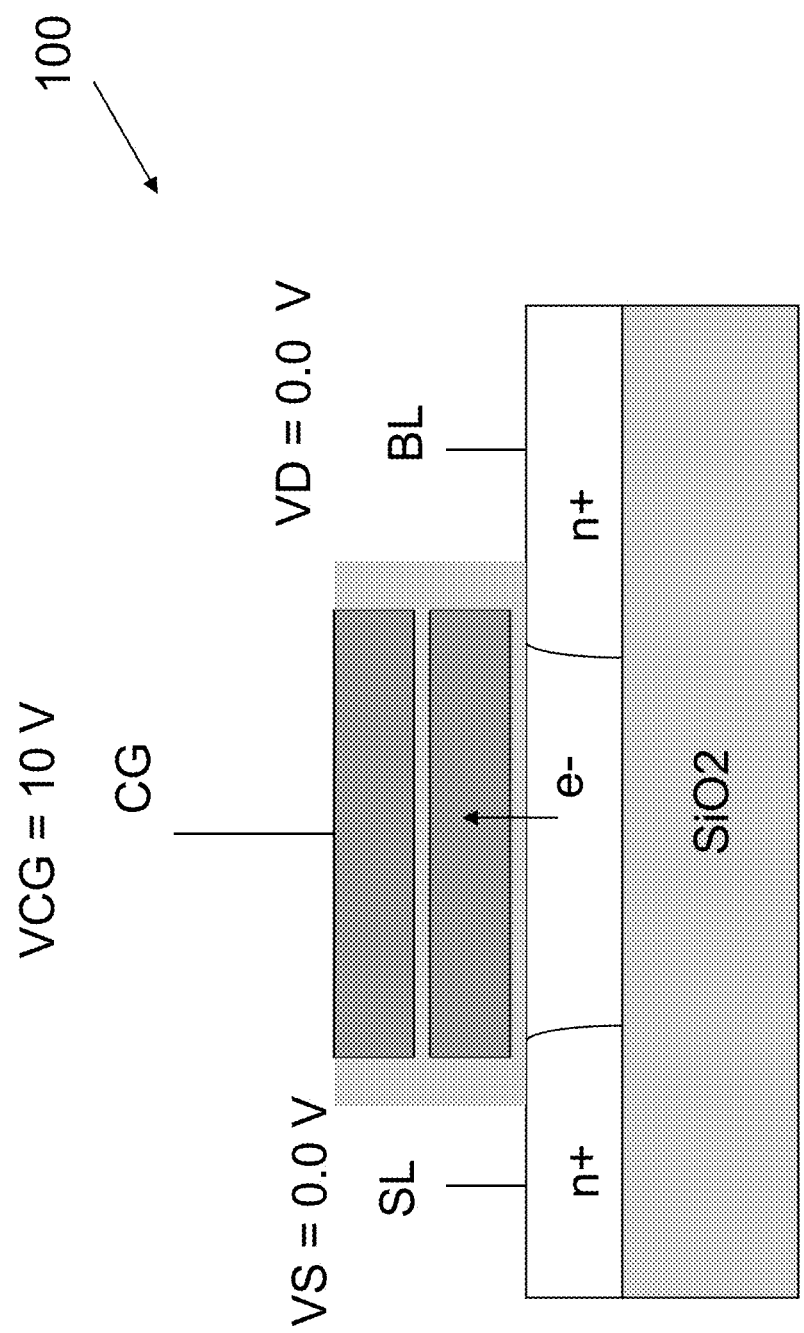
FIG. 6 shows operation of the transistor as a flash memory device when writing or programming logic "0" using electron tunneling in accordance with an embodiment of the present disclosure.

FIG. 6 shows operation of the transistor 100 as a flash memory device when writing or programming logic "0" using electron tunneling in accordance with an embodiment of the present disclosure. The transistor 100 of this embodiment is an N-channel or nMOS FET, as described above, but is not so limited (e.g., transistor 100 may be a P-channel or pMOS FET in an alternative embodiment). The N-channel device includes source 110 and drain 120 regions comprising N+-type material while the body region 104 comprises a P-type material.

A logic "0" programming operation of an embodiment of the transistor operating as a flash memory device is carried out using electron tunneling through the application of control signals. Control signals having predetermined voltages (for example, Vg=10 v, Vs=0.0 v, and Vd=0.0 v) are applied to gate 102, source region 110 and drain region 120 (respectively) of transistor 100. The control signals prevent source current from flowing in the electrically floating body region 104 of transistor 100. More specifically, the potential difference between the source voltage and the drain voltage (e.g., 0 volts) is less than the threshold required to turn on the bipolar transistor 100. Therefore, the transistor remains in an "off" state such that no source current is produced and/or induced in transistor 100.

In addition to the effect of the control signals applied to the source and drain of the transistor 100, as described above, the electrical signal applied to the control gate causes the floating gate transistor to act like an electron gun. As a result of the polarity (e.g., positive) of the control signal applied to the floating gate, the excited electrons of the floating body 104 are pushed through thus placing negative charge on the floating gate. The floating gate is negatively charged as a result of this addition of negative charge, and the resultant negative charge residing at the floating gate 102 represents, in memory terms, a "0", or logic low state, until such time as the memory is erased. Thus, in this embodiment, the predetermined voltages of the applied control signals program or write logic "0" in the transistor 100 via electron tunneling from the floating body 104 to the floating gate 102.

Figure 7:
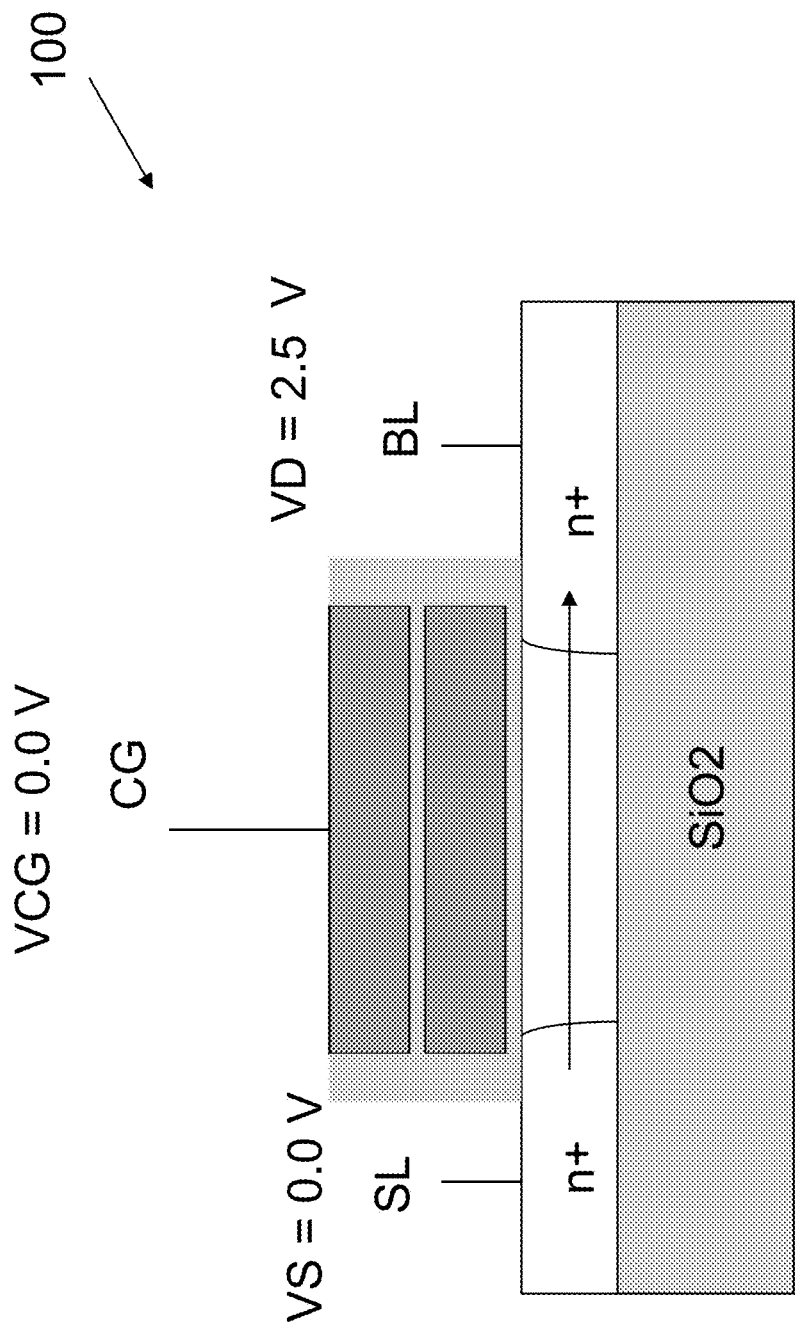
FIG. 7 shows operation of the transistor operating as a flash memory device when reading data of the transistor in accordance with an embodiment of the present disclosure.

FIG. 7 shows operation of the transistor 100 operating as a flash memory device when reading data of the transistor in accordance with an embodiment of the present disclosure. In one embodiment, the data state of the transistor may be read and/or determined by applying control signals having predetermined voltages to the floating gate, source region and drain region of transistor (for example, Vg=0.0 v, Vs=0.0 v and Vd=2.5 v, respectively). Such control signals, in combination, induce and/or cause a source current in transistors that have a positive charge on the floating gate (transistors programmed to logic "1") as described above. As such, sensing circuitry (for example, a cross-coupled sense amplifier), which is coupled to the transistor, senses the data state using primarily and/or based substantially on the source current. For those transistors having negative charge on the floating gate (transistors programmed to logic "0"), such control signals induce, cause and/or produce little to no source current (for example, a considerable, substantial or sufficiently measurable source current).

Thus, in response to read control signals, the transistor 100 generates a source current which is representative of the data state of the transistor 100. Where the data state is logic high or logic "1", the transistor 100 provides a substantially greater source current than where the data state is logic low or logic "0". The transistor 100 may provide little to no source current when the data state is logic low or logic "0". Data sensing circuitry determines the data state of the transistor based substantially on the source current induced, caused and/or produced in response to the read control signals.

Figure 8:
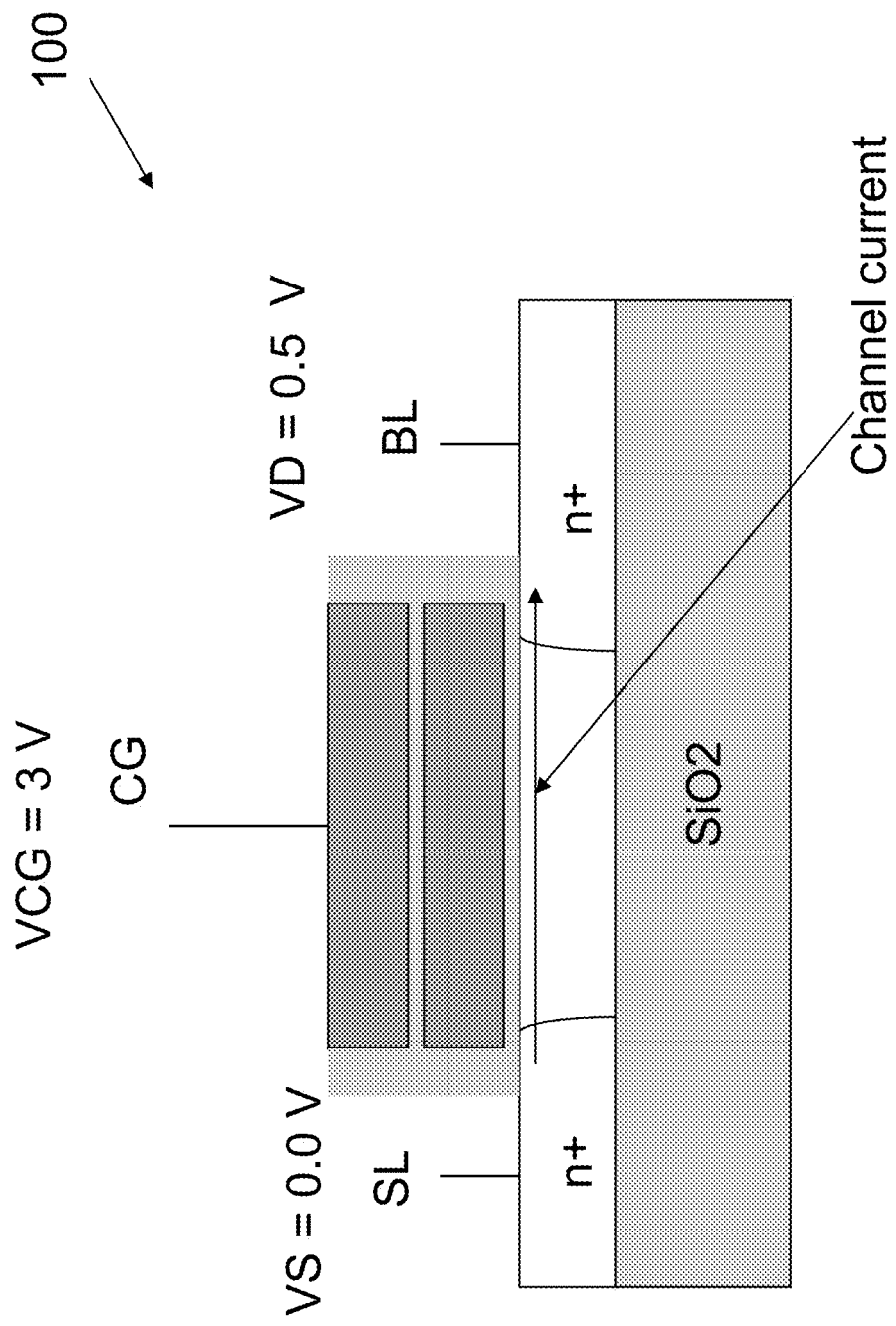
FIG. 8 shows operation of the transistor operating as a flash memory device when reading data of the transistor in accordance with an alternative embodiment of the present disclosure.

FIG. 8 shows operation of the transistor 100 operating as a flash memory device when reading data of the transistor in accordance with an alternative embodiment of the present disclosure. In this alternative embodiment, the data state of the transistor 100 may be read and/or determined by applying control signals having predetermined voltages to the floating gate, source region and drain region of transistor (for example, Vg=3 v, Vs=0.0 v and Vd=0.5 v, respectively). Such control signals, in combination, induce and/or cause a channel current in transistors that have a positive charge on the floating gate (transistors programmed to logic "1") as described above. As such, sensing circuitry (for example, a cross-coupled sense amplifier) (not shown), which is coupled to the transistor 100, senses the data state using primarily and/or based substantially on the source current. For those transistors having a negative charge on the floating gate (transistors programmed to logic "0"), such control signals induce, cause and/or produce little to no channel current (for example, a considerable, substantial or sufficiently measurable source current).

Thus, in response to read control signals, the transistor 100 generates a channel current which is representative of the data state of the transistor 100. Where the data state is logic high or logic "1", the transistor 100 provides a substantially greater channel current than where the data state is logic low or logic "0". The transistor 100 may provide little to no channel current when the data state is logic low or logic "0". Data sensing circuitry determines the data state of the transistor based substantially on the channel current induced, caused and/or produced in response to the read control signals.

Figure 9:
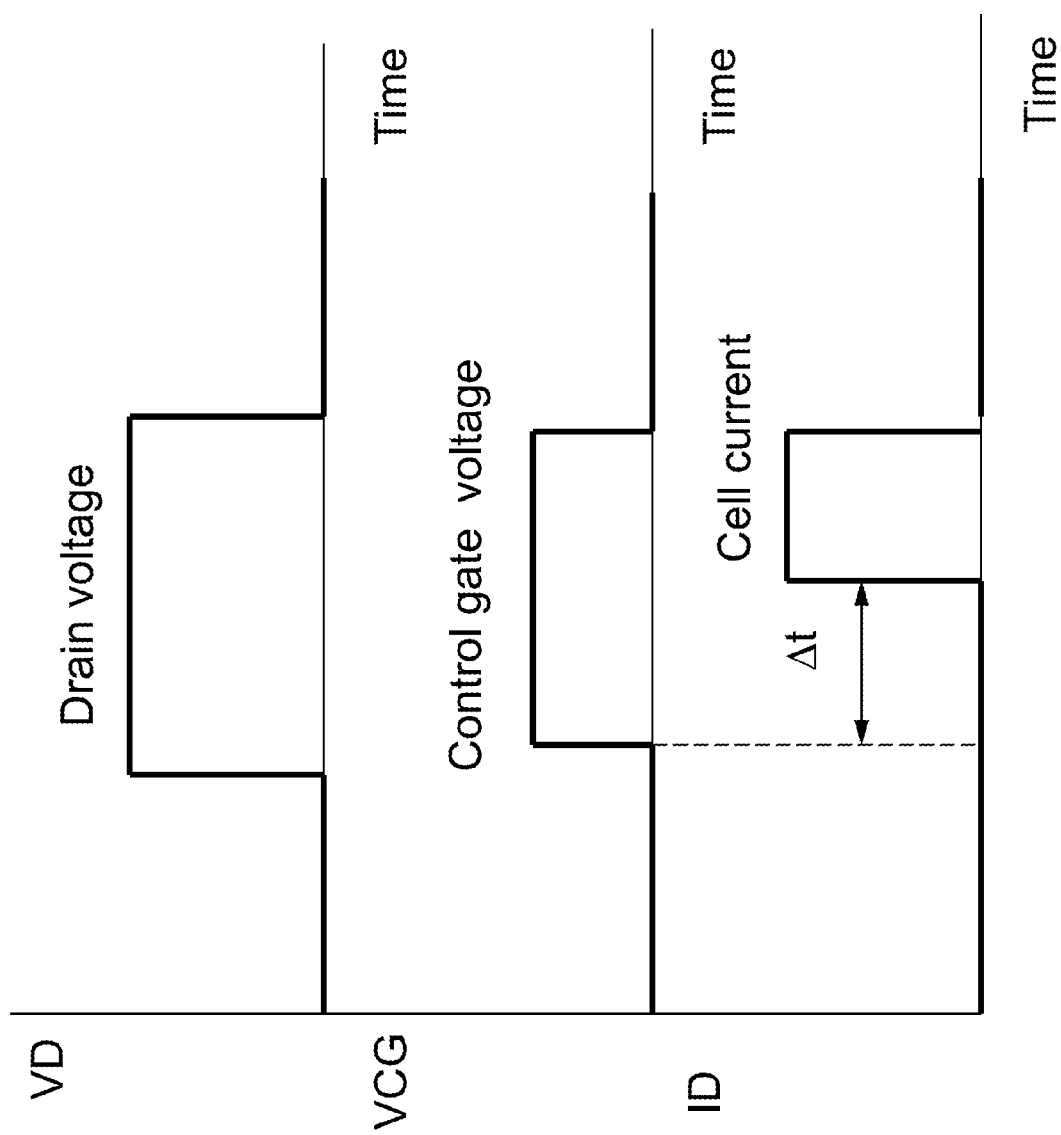
FIG. 9 shows representative control signals along with the cell current ID during operation of transistors as a flash memory device when reading data of multi-bit flash cells in accordance with another alternative embodiment of the present disclosure.

The application of control signals can also be used to read transistors of an embodiment when used in multi-bit flash cells. Considering a single transistor, in an embodiment, the voltage of the control signal applied to the control gate is selected to put the transistor in the sub-threshold regime. In the sub-threshold regime, the bipolar triggering time is very sensitive to the transistor threshold voltage Vt. As the threshold voltage Vt is defined by the charge stored in the floating gate, the bipolar triggering delay Δt provides information about charge stored in the floating gate and can be used to read the multi-bit Flash. FIG. 9 shows representative control signals along with the cell current ID during operation of transistors 100 as a flash memory device when reading data of multi-bit flash cells in accordance with another alternative embodiment of the present disclosure.

The floating gate transistor 100 of an embodiment can function as a flash memory device, operations of which were described in detail above. Additionally, the floating gate transistor 100 can also function as a DRAM device, operations of which are described in detail below.

Figure 10:
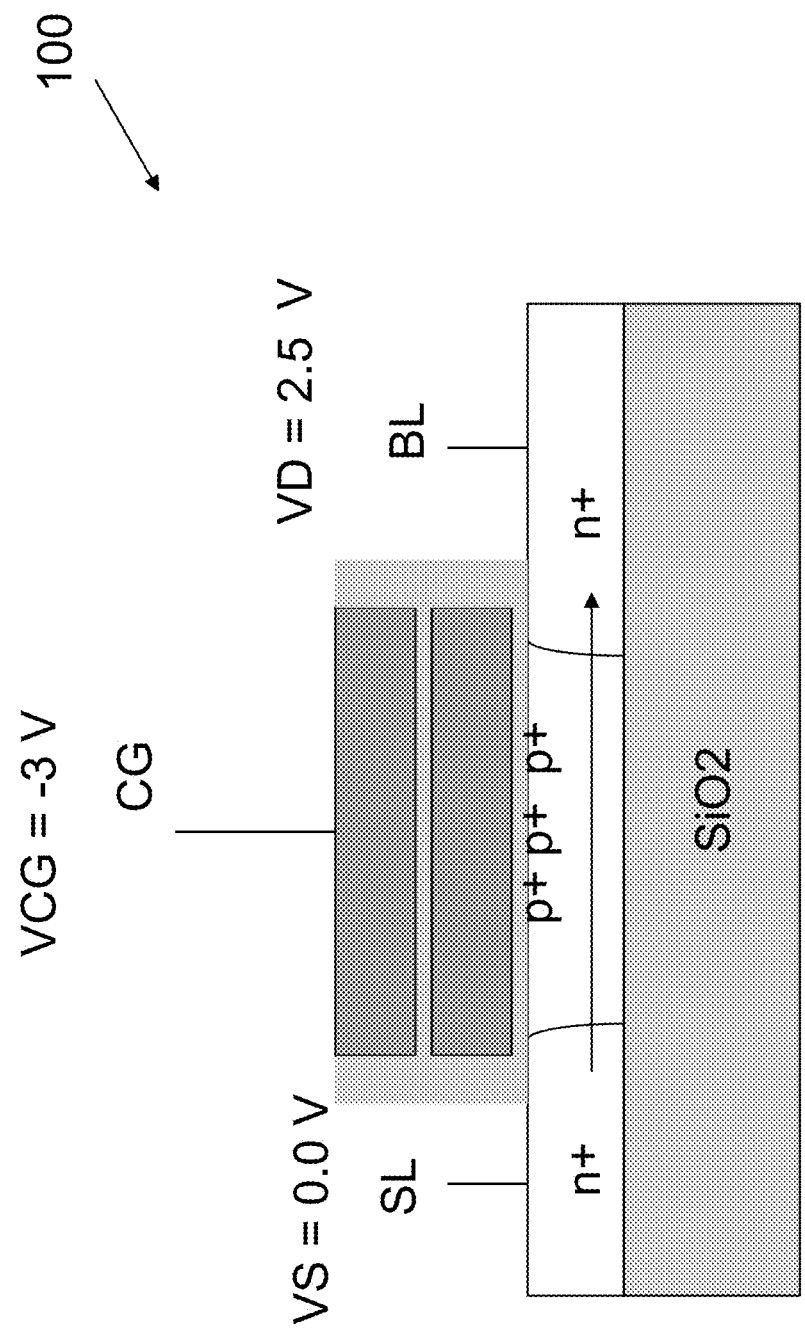
FIG. 10 shows operation of the transistor as a DRAM device when writing or programming logic "1" in accordance with an embodiment of the present disclosure.

FIG. 10 shows operation of the transistor 100 as a DRAM device when writing or programming logic "1" in accordance with an embodiment of the present disclosure. The transistor 100 of this embodiment is an N-channel or nMOS FET, as described above, but is not so limited; transistor 100 may be a P-channel or pMOS FET in an alternative embodiment.

A logic "1" programming operation of an embodiment of the transistor operating as a DRAM device is carried out through the application of control signals. In operation, when writing or programming logic "1", in one embodiment, control signals having predetermined voltages (for example, Vg=−3 v, Vs=0.0 v, and Vd=2.5 v) are applied to gate, source region and drain region (respectively) of transistor 100. The control signals may result in an accumulation of minority carriers in the electrically floating body. As a result of the control signal applied to the gate, any minority carriers that happen to be present in the body region accumulate in the first portion of the body. The minority carriers may accumulate in an area of the first portion under the gate, but are not so limited.

The control signals also generate or provide a source current in electrically floating body region of transistor 100. More specifically, the potential difference between the source voltage and the drain voltage (e.g., 2.5 volts) is greater than the threshold required to turn on the bipolar transistor. Therefore, source current of the transistor causes or produces impact ionization and/or the avalanche multiplication phenomenon among particles in the electrically floating body region. The impact ionization produces, provides, and/or generates an excess of majority carriers in the electrically floating body region of transistor 100.

Notably, it is preferred that the source current responsible for impact ionization and/or avalanche multiplication in electrically floating body region is initiated or induced by the control signal applied to gate of transistor 100 along with the potential difference between the source and drain regions. Such a control signal may induce channel impact ionization which raises or increases the potential of body region and "turns on", produces, causes and/or induces a source current in transistor 100. One advantage of the proposed writing/programming technique is that a large amount of the excess majority carriers may be generated and stored in electrically floating body region of transistor 100.

As a result of the polarity (e.g., negative) of the control signal applied to the gate, the majority carriers of the body region accumulate near the surface of the first portion of the body region. The polarity of the gate signal (e.g., negative) combined with the floating body causes the majority carriers to become trapped or "stored" near the surface of the first portion of the body region. In this manner the body region of the transistor "stores" charge (e.g., equivalently, functions like a capacitor). Thus, in this embodiment, the predetermined voltages of the control signals program or write logic "1" in transistor 100 via impact ionization and/or avalanche multiplication in electrically floating body region.

Figure 11:
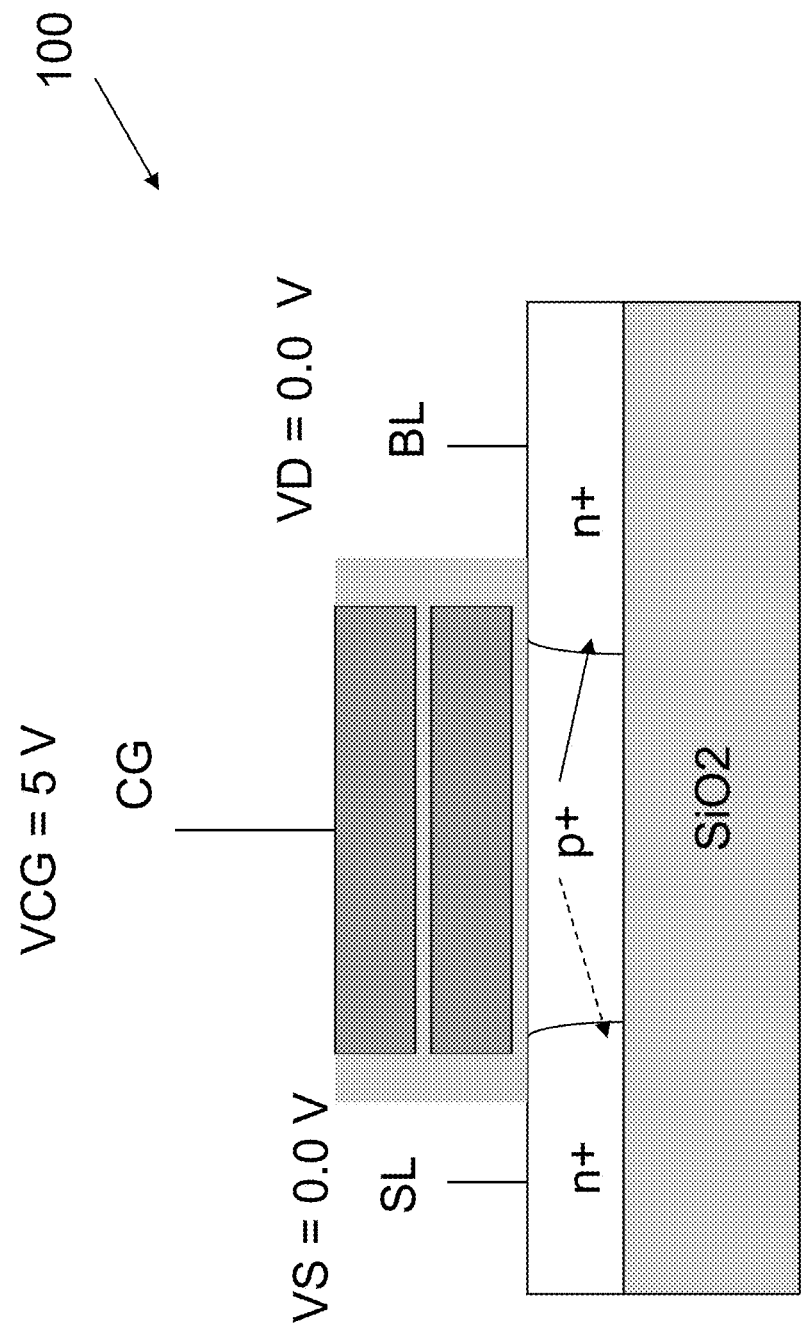
FIG. 11 shows operation of the transistor as a DRAM device when writing or programming logic "0" in accordance with an embodiment of the present disclosure.

FIG. 11 shows operation of the transistor 100 as a DRAM device when writing or programming logic "0" in accordance with an embodiment of the present disclosure. A logic "0" programming operation of an embodiment of the transistor operating as a DRAM device is carried out through the application of control signals. In operation, when writing or programming logic "0", in one embodiment, control signals having predetermined voltages (for example, Vg=5 v, Vs=0.0 v, and Vd=0.0 v) are initially applied to gate, source region and drain region (respectively) of transistor 100. The control signals may result in an accumulation of minority carriers in the electrically floating body.

The potential difference between the source voltage and the drain voltage (e.g., 0 volts) of the control signals, however, is less than the threshold required to turn on transistor 100. Consequently, no impact ionization takes place among particles in the body region and no bipolar or source current is produced in the electrically floating body region. Thus, no excess of majority carriers are generated in the electrically floating body region of transistor 100.

The polarity (e.g., positive) of the gate signal may result in any minority carriers that accumulate being removed from electrically floating body region of transistor 100 via one or more of the source region and the drain region. The result is an absence of excess majority carriers in the body region so that, in this manner, the predetermined voltages of the control signals program or write logic "0" in the transistor 100.

Figure 12:
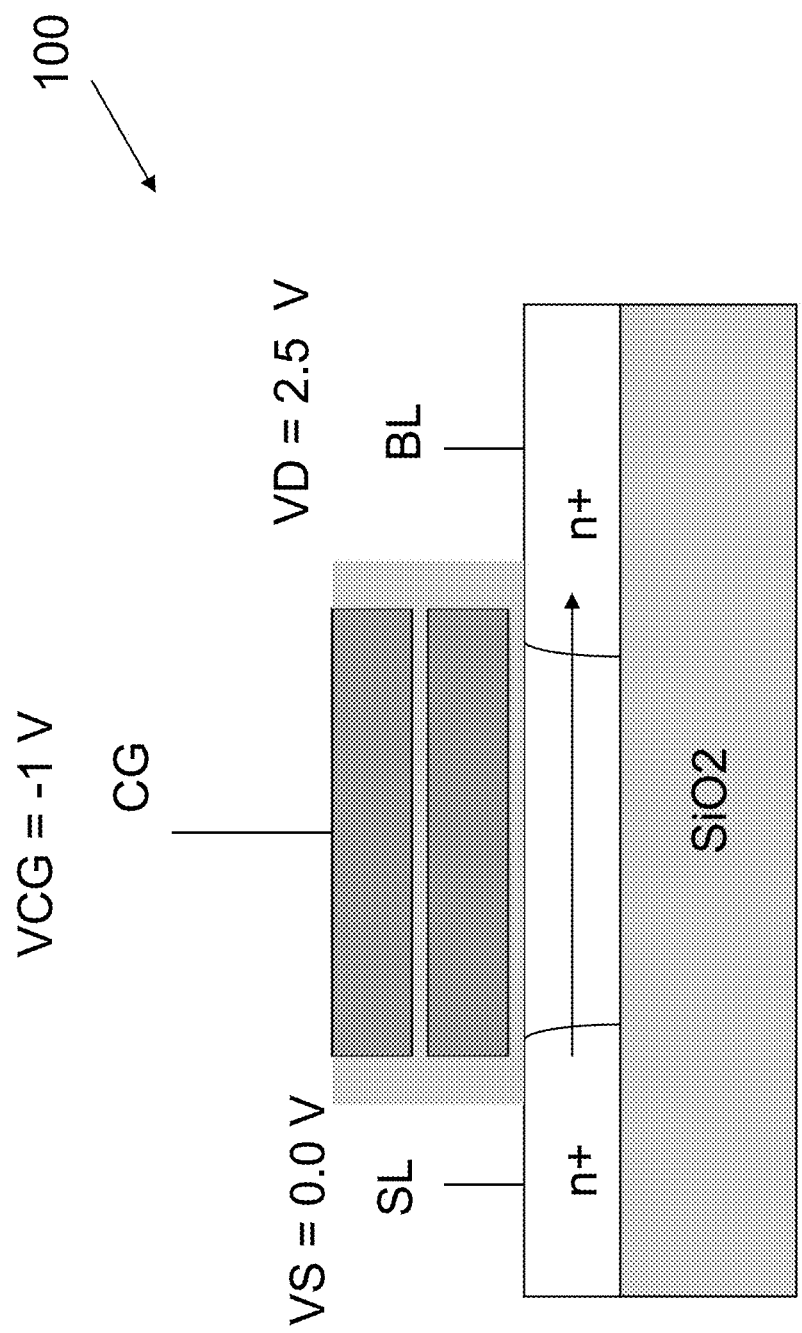
FIG. 12 shows operation of the transistor operating as a DRAM device when reading data of the transistor in accordance with an embodiment of the present disclosure.

FIG. 12 shows operation of the transistor 100 operating as a DRAM device when reading data of the transistor in accordance with an embodiment of the present disclosure. In one embodiment, the data state of the transistor may be read and/or determined by applying control signals having predetermined voltages to the floating gate, source region and drain region of transistor (for example, Vg=−1 v, Vs=0.0 v and Vd=2.5 v, respectively). Such control signals, in combination, induce and/or cause a source current in transistors that are programmed to logic "1" as described above. As such, sensing circuitry (for example, a cross-coupled sense amplifier) (not shown), which is coupled to transistor 100 (for example, drain region 22), senses the data state using primarily and/or based substantially on the source current. For those transistors that are programmed to logic "0", such control signals induce, cause and/or produce little to no source current (for example, a considerable, substantial or sufficiently measurable source current).

Thus, in response to read control signals, transistor 100 generates a source current which is representative of the data state of the transistor 100. Where the data state is logic high or logic "1", transistor 100 provides a substantially greater source current than where the data state is logic low or logic "0". Transistor 100 may provide little to no source current when the data state is logic low or logic "0". Data sensing circuitry determines the data state of the transistor based substantially on the source current induced, caused and/or produced in response to the read control signals.

The voltage levels described herein as control signals to implement the write and/or read operations are provided merely as examples, and the embodiments described herein are not limited to these voltage levels. The indicated voltage levels may be relative or absolute. Alternatively, the voltages indicated may be relative in that each voltage level, for example, may be increased or decreased by a given voltage amount (for example, each voltage may be increased or decreased by 0.5, 1.0 and 2.0 volts) whether one or more of the voltages (for example, the source, drain or gate voltages) become or are positive and negative.

The aspects of the present disclosure may be implemented in an integrated circuit device (for example, a discrete memory device or a device having embedded memory) including a memory array having a plurality of memory cells arranged in a plurality of rows and columns wherein each memory cell includes an electrically floating body transistor. The memory arrays may comprise N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

The programming and reading techniques described herein may be used in conjunction with a plurality of memory cells arranged in an array of memory cells. A memory array implementing the structure and techniques of the present disclosure may be controlled and configured including a plurality of memory cells having a separate source line for each row of memory cells (a row of memory cells includes a common word line). The memory array may use any of the example programming, holding and/or reading techniques described herein. The memory arrays may comprise N-channel, P-channel and/or both types of transistors. Circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells in the memory array(s), suitable write and read voltages (for example, negative voltages) are well known to those skilled in the art in light of the present disclosure.

The transistors, memory cells, and/or memory array(s) described herein may be fabricated using well known techniques and/or materials. Indeed, any fabrication technique and/or material, whether now known or later developed, may be employed to fabricate the transistors, memory cells, and/or memory array(s). For example, embodiments of the present disclosure may employ silicon, germanium, silicon/germanium, gallium arsenide or any other semiconductor material (whether bulk-type or SOI) in which transistors may be formed. As such, the transistors, memory cells, and/or memory array(s) may be disposed on or in (collectively "on") SOI-type substrate or a bulk-type substrate.

Further, memory array(s) may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include FD-type transistors (whether P-channel and/or N-channel type). Alternatively, such circuitry may include PD-type transistors (whether P-channel and/or N-channel type). There are many techniques to integrate both PD and/or FD-type transistors on the same substrate. All such techniques, whether now known or later developed, are intended to fall within the scope of the present disclosure. Where P-channel type transistors are employed as memory cells in the memory array(s), suitable write and read voltages (for example, negative voltages) are well known to those skilled in the art in light of the present disclosure.

Notably, transistor 100 may be a symmetrical or non-symmetrical device. Where transistor 100 is symmetrical, the source and drain regions are essentially interchangeable. However, where transistor 100 is a non-symmetrical device, the source or drain regions of transistor 100 have different electrical, physical, doping concentration and/or doping profile characteristics. As such, the source or drain regions of a non-symmetrical device are typically not interchangeable. This notwithstanding, the drain region of the transistor 100 (whether the source and drain regions are interchangeable or not) is that region of the transistor that is connected to the bit line/sense amplifier.

There are many aspects of the present disclosure described and illustrated herein. While certain embodiments, features, attributes and advantages of the present disclosure have been described and illustrated, it should be understood that many others, as well as different and/or similar embodiments, features, attributes and advantages of the present disclosure, are apparent from the description and illustrations. As such, the embodiments, features, attributes and advantages of the present disclosure described and illustrated herein are not exhaustive and it should be understood that such other, similar, as well as different, embodiments, features, attributes and advantages of the present disclosure are within the scope of the present disclosure.

As mentioned above, the illustrated/example voltage levels to implement the read and write operations are merely examples. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the source, drain or gate voltages) become or are positive and negative.

As mentioned above, each of the aspects of the present disclosure, and/or embodiments thereof, may be employed alone or in combination with one or more of such aspects and/or embodiments. For the sake of brevity, those permutations and combinations will not be discussed separately herein. As such, the present disclosure is not limited to any single aspect (or embodiment thereof), nor to any combinations and/or permutations of such aspects and/or embodiments.

Moreover, the above embodiments of the present disclosure are merely example embodiments. They are not intended to be exhaustive or to limit the present disclosure to the precise forms, techniques, materials and/or configurations disclosed. Many modifications and variations are possible in light of the above teaching. It is to be understood that other embodiments may be utilized and operational changes may be made without departing from the scope of the present disclosure. As such, the foregoing description of the example embodiments of the present disclosure have been presented for the purposes of illustration and description. Many modifications and variations are possible in light of the above teaching. It is intended that the scope of the present disclosure not be limited solely to the description above.

The invention claimed is:

1. A semiconductor device comprising:
a floating gate;
a control gate disposed over the floating gate;
a body region that is electrically floating, wherein the body region is disposed beneath the floating gate and configured so that material forming the body region extends beyond at least one lateral boundary of the floating gate;
a source region disposed adjacent a first portion of the body region; and
a drain region disposed adjacent a second portion of the body region.

2. The device of claim 1, wherein the floating gate is separated from the body region by a dielectric.

3. The device of claim 1, wherein the control gate is separated from the floating gate by a dielectric.

4. The device of claim 1, wherein the body region comprises a first type of semiconductor material.

5. The device of claim 4, wherein the source region comprises a second type of semiconductor material different from the first type of semiconductor material.

6. The device of claim 5, wherein the drain region comprises the second type of semiconductor material.

7. The device of claim 4, wherein the source region comprises the first type of semiconductor material doped with impurities.

8. The device of claim 7, wherein the drain region comprises the second type of semiconductor material doped with impurities.

9. The device of claim 8, wherein the source region and the drain region have a common first doping polarity.

10. The device of claim 9, wherein the source region and the drain region are doped with donor impurities.

11. The device of claim 9, wherein the source region and the drain region are doped with acceptor impurities.

12. The device of claim 9, wherein the source region and the drain region have different doping concentrations.

13. The device of claim 9, wherein the body region has a second polarity different from the first doping polarity.

14. The device of claim 1, wherein the source region is disposed outside of a lateral boundary of the floating gate.

15. The device of claim 14, wherein the drain region is disposed outside of the lateral boundary of the floating gate.

16. The device of claim 14, wherein at least a portion of the drain region is disposed inside of the lateral boundary of the floating gate.

17. The device of claim 1, wherein the drain region is disposed outside of a lateral boundary of the floating gate.

18. The device of claim 17, wherein the source region is disposed outside of the lateral boundary of the floating gate.

19. The device of claim 17, wherein at least a portion of the source region is disposed inside of the lateral boundary of the floating gate.

20. The device of claim 1, further comprising circuitry to apply a first signal set including a first potential difference coupled between the source region and the drain region and a first gate signal coupled to the control gate, wherein the first signal set programs a first logic state in the floating gate.

21. The device of claim 20, further comprising circuitry to apply a second signal set including a second potential difference coupled between the source region and the drain region and a second gate signal coupled to the control gate, wherein the second signal set programs a second logic state in the floating gate.

22. The device of claim 21, further comprising circuitry to apply a third signal set including a third potential difference coupled between the source region and the drain region and a third gate signal coupled to the control gate, wherein the third signal set reads a logic state in the floating gate.

23. The device of claim 22, further comprising circuitry to apply a fourth signal set including a fourth potential difference coupled between the source region and the drain region and a fourth gate signal coupled to the control gate, wherein the fourth signal set programs a logic state in the body region.

24. The device of claim 23, further comprising circuitry to apply a fifth signal set including a fifth potential difference coupled between the source region and the drain region and a fifth gate signal coupled to the control gate, wherein the fifth signal set reads a logic state in the body region.

* * * * *